(12) United States Patent
Nishi

(10) Patent No.: US 6,894,449 B2
(45) Date of Patent: May 17, 2005

(54) VIBRATION CONTROL DEVICE, STAGE DEVICE AND EXPOSURE APPARATUS

(75) Inventor: Kenji Nishi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/623,507

(22) Filed: Jul. 22, 2003

(65) Prior Publication Data

US 2004/0017167 A1 Jan. 29, 2004

(30) Foreign Application Priority Data

Jul. 26, 2002 (JP) .................................. 2002-218157

(51) Int. Cl.$^7$ ............................................. H02K 33/00
(52) U.S. Cl. ...................... 318/114; 310/90.5; 310/12
(58) Field of Search ............................. 318/114; 310/12; 355/53, 72; 267/140.14

(56) References Cited

U.S. PATENT DOCUMENTS

| | | | |
|---|---|---|---|
| 5,448,332 A | 9/1995 | Sakakibara et al. | ............ 355/53 |
| 6,328,362 B1 * | 12/2001 | Isogai et al. | ............... 294/64.1 |
| 6,337,484 B1 | 1/2002 | Loopstra et al. | ....... 250/442.11 |
| 6,354,576 B1 * | 3/2002 | Jacobs et al. | .......... 267/140.14 |
| 6,473,161 B1 * | 10/2002 | Cuijpers et al. | ............... 355/53 |
| 2002/0005939 A1 | 1/2002 | Cuijpers et al. | ............... 355/53 |

FOREIGN PATENT DOCUMENTS

JP        06-283403        10/1994        ......... H01L/21/027

* cited by examiner

Primary Examiner—Darren Schuberg
Assistant Examiner—Judson H. Jones
(74) Attorney, Agent, or Firm—Oliff & Berridge, PLC

(57) ABSTRACT

In order to remove vibration or improve a vibration control effect, and achieve device size reduction, an adjusting device is provided in which a weight of a support target object is supported by a pressure of an internal gas of a first chamber gas via a holding member and which adjusts a position in a gravity direction of the holding member by driving a movable member which changes an internal volume of the first gas chamber by changing an internal volume of a second gas chamber based on a state change of at least one of first and second gas chambers. Because of this, when the holding member is displaced in the gravity direction because of the vibration or the like, as the movable member is driven by the adjusting device, the holding member is maintained at an original position. Additionally, the movable member does not contact the support target object, so it does not directly deform the support target object, and the support target object is only driven by the change of the internal volume of the gas chambers; thus, even if the rigidity of the gas within the first gas chamber is high, there will be no problem regarding transmission of vibrations.

35 Claims, 15 Drawing Sheets

VIBRATION CONTROL DEVICE, STAGE DEVICE AND EXPOSURE APPARATUS

INCORPORATION BY REFERENCE

This application is based on Japanese Patent Application 2002-218157 filed Jul. 26, 2002, the disclosure of which is incorporated herein by reference in its entirety.

BACKGROUND OF THE INVENTION

1. Field of Invention

This invention relates to a vibration control device, a stage device, and an exposure apparatus, and more specifically to a vibration control device which holds an object and controls vibration, a stage device provided with the vibration control device, and an exposure apparatus having the stage device.

2. Description of Related Art

Conventionally, in a lithographic process which manufactures a semiconductor element, a liquid crystal display element, or the like, it is known to use a step-and-repeat type reduction projection exposure apparatus (so-called stepper) or a step-and-scan type scanning projection exposure apparatus (so called scanning stepper). The stepper transfers a pattern formed in a mask or a reticle (hereafter referred to as "reticle") onto a substrate such as a wafer, a glass plate, or the like coated by a resist or the like via a projection optical system while the reticle and substrate are stationary. The scanning stepper improves upon the stepper in that it synchronously moves the reticle and substrate during exposure, thereby increasing the imaging field.

In these types of exposure apparatus, a positional relationship among a projection optical system, a wafer, and a reticle is most important, and is the main factor which determines exposure performance capability. Because of this, the positional relationship among a projection optical system, a reticle stage on which a reticle is mounted, and a wafer stage on which a wafer is measured by an optical position sensor (e.g., an interferometer, a synchronizing detecting wave type optical system, or the like), and positioning between the reticle and the wafer is performed with high accuracy based on the measurement result.

In order to accomplish the positioning with high accuracy, it is desirable to isolate vibrations from being transmitted to the projection optical system, the wafer stage, and the reticle stage from sources of vibrations. Examples of vibration factors (vibration sources) are: (a) external vibration (micro vibration) of a clean room floor surface (i.e., the foundation or supporting surface of the machine) in which an exposure apparatus is installed; (b) so-called called return vibration in which, when a reaction force that accompanies the driving of the stage and that is generated within the exposure apparatus is transmitted to the floor, particularly when the floor rigidity is weak, the reaction force oscillates the floor surface and the vibration returns to the exposure apparatus from the floor surface and becomes a vibration factor of the exposure apparatus; (c) vibration in which a reaction force generated at the time of the driving of the reticle stage or the wafer stage oscillates a supporting plate in which guide surfaces of the stages are formed, and this vibration is transmitted to the projection optical system via a body of the exposure apparatus; and (d) vibration from a cable, a wiring, conduits or the like connected to the stages.

In the exposure apparatus, in order to control or prevent the various vibrations from being transmitted to the projection optical system, the wafer stage, the reticle stage, and other parts of the body of the exposure apparatus are supported by a vibration control mechanism. With respect to the vibration control mechanism, there are many mechanisms that support a target object (i.e., the stages, etc.) by three or four points. For example, in the case of a vibration control mechanism supporting the exposure apparatus itself, it is desirable that a vibration control effect is seen relative to six degrees-of-freedom directions (X, Y, Z, θz, θx, θy) with respect to the floor. This is because if the floor or the apparatus itself is considered as an elastic body instead of a rigid body, even if a vibration occurs in a specified direction, depending on the oscillating mode, there is a possibility that the vibration can be converted to various vibration directions.

FIG. 17(A) schematically shows an example of a conventional vibration control device. A vibration control device 931 shown in FIG. 17(A) is provided with an air cushion portion 951 supporting a support target object OB and a micro driving portion 976 which can micro-drive the support target object OB in a gravity direction (vertical direction within a paper plane of FIG. 17(A)) with high responsiveness.

The air cushion portion 951 is provided with a housing 961 having an upper aperture, a holding member 962 which is provided on an elastic member that seals the aperture of the housing 961 and holds the support target object OB, a diaphragm 963 (the elastic member) which connects the holding member 962 with the housing 961, and, along with the housing 961 and the holding member 962, forms a gas chamber 969 in a substantially air tight state, and an electromagnetic regulator 955 which adjusts gas, e.g., air pressure, filled within the gas chamber 969.

Furthermore, the micro driving portion 976 is provided with a voice coil motor 974 having movable portions 974*a* directly fixed to the support target object OB and stators 974*b* which electromagnetically interact with the movable portions 974*a* and generate an electromagnetic force which drives the support target object OB in a gravity direction, and an electric current supply source 975 which supplies a driving electric current to the voice coil motor 974.

In the vibration control device 931 thus structured, for example, if an offset load is generated along with the movement of the stage arranged on the support target object OB, according to the output of an undepicted displacement sensor (e.g., an optical position sensor or the like), based on the measurement value of an undepicted pressure sensor, the electromagnetic regulator 955 is controlled, and gas within the gas chamber 969, e.g., an air pressure is controlled. However, the internal pressure of the gas within the gas chamber is high, so only approximately 20 Hz of control response is obtained. Therefore, if a high response control is needed, according to the output of an undepicted accelerometer or the like, the voice coil motor 974 needs to be controlled. Of course, micro vibration, such as floor vibration is removed by an air spring of the air cushion portion 951.

In FIG. 17(B), a vibration control device 931' is shown in which a metal bellows forming an internal gas chamber is used for an air cushion portion 951'. Even in the case of using this type of structure, if the structure is relatively light, in the same manner as the vibration control device of FIG. 17(A), vibration control and movement of the support target object OB is effectively performed.

SUMMARY OF THE INVENTION

In order to reduce a footprint of an exposure apparatus and/or reduce the cost, it is desirable to provide a smaller vibration control device, and particularly a smaller air cushion portion. However, in the case of the device of FIG. 17(A), for example, as in the vibration control device 931' shown in FIG. 18(A), if a gas chamber 969' with a small internal volume is formed by using a housing 961' with a height lower than that of the housing 961, a compact vibration control device is formed. However, rigidity increases as an air spring becomes shorter, so vibration from the floor is easily transmitted to the support target object OB, and an vibration removal performance capability deteriorates. Meanwhile, if the housing 961" with a width narrower than that of the housing 961 is formed as shown in the vibration control device 931" of FIG. 18(B), the internal volume of the gas chamber 969" becomes smaller, and rigidity as an air spring increases in the same manner as above. In addition, if the internal pressure is not made high, controllability becomes difficult.

Additionally, in the vibration control device 931, by connecting the housing 961 and the holding member 962 with a diaphragm, air tightness is maintained, the internal pressure of the gas chamber 969 is kept high, and the holding member 962 can be flexibly moved. However, as a diaphragm, there are many cases that, for example, rubber or other materials having elasticity which is about the same as rubber, e.g., leather or the like, is used. In this case, for example, floor vibration or the like which affects the housing is easily transmitted to the support target object OB due to the rigidity of the diaphragm itself. In particular, in this structure, rigidity in the gravity direction is small, but rigidity in a horizontal direction and a twisting direction is strong, so a sufficient damping effect of floor vibration, i.e., a vibration removal effect, could not have been sufficiently obtained.

Furthermore, in the vibration control device 931, by using the voice coil motor 974, a high response control is accomplished. However, in the case of the vibration control device holding a large apparatus such as an exposure apparatus, an object weighing approximately 10 tons is supported at three or four locations, so the weight corresponding to approximately three tons for one location needs to be supported and moved upwardly and downwardly, so a voice coil motor which generates an extremely large thrust is needed. Because of this, a voice coil motor itself becomes large, and the electricity consumption increases.

Furthermore, as is clear from FIGS. 17(A) and (B), in a conventional vibration control device, the position at which the air cushion portion supports a structural object is shifted (i.e., offset) from the position of a point of application of a driving force by a voice coil motor, so if the internal pressure control within the gas chamber and the position control of the support target object OB by the voice coil motor 974 are not simultaneously performed for the electromagnetic regulator 955, distortion is generated in the support target object OB, and this causes the deterioration of the control accuracy in the respective parts of the exposure apparatus.

This invention addresses these problems. A first object of this invention is to provide a new type of vibration control device with good vibration removal or vibration control performance capability. A second object of this invention is to provide a stage device in which vibration generation is held to a minimum. A third object of this invention is to provide an exposure apparatus which can accomplish exposure with high accuracy.

A vibration control device according to one aspect of the invention is provided with: a holding member that holds an object; a first gas chamber that supports the holding member in a gravity direction through internal gas pressure; a second gas chamber coupled to the first gas chamber and having a volume smaller than that of the first gas chamber, a movable member that changes the volume of the second gas chamber and changes the volume of the first gas chamber; and an adjusting device that drives the movable member and adjusts a position of the holding member in the gravity direction based on the state change of at least one of the first and second gas chambers.

Here, "a state change of at least one of the first and second gas chambers" includes a change of a position in the gravity direction of the holding member and a change of the internal volume of the respective gas chambers, and means a change of a state of the respective gas chambers due to vibration transmitted to the vibration control device from the object side or from the outside. In this specification, "state change" is used to include this meaning.

According to this aspect of the invention, a holding member which holds an object is supported in the gravity direction by pressure of the internal gas of the first gas chamber (more accurately, gas filled in the first gas chamber and filled in the second gas chamber connected to the first gas chamber). That is, the weight of the object is supported by pressure of the internal gas via a holding member. Furthermore, based on a state change of at least one of the first and second gas chambers, by changing the internal volume of the second gas chamber and driving a movable member which changes the internal volume of the first gas chamber, an adjusting device is provided which adjusts the position in the gravity direction of the holding member. Because of this, for example, if a holding member (and an object) is displaced in a gravity direction due to vibration or the like, as the adjusting device drives the movable member, the position in the gravity direction of the holding member can be maintained at the original position. That is, vibration which acts on the holding member (and the object) is promptly controlled.

Furthermore, the movable member does not have a part contacting the object, so even if the movable member is driven, this does not directly generate distortion or the like on the object, and the object is only driven in the gravity direction by the change of the internal volume of the first and second gas chambers. Therefore, a structure can be used in which rigidity of the gas within the first gas chamber is high, and a volume smaller than that of a conventional device can be used for the first gas chamber.

Furthermore, the internal volume of the second gas chamber is smaller than that of the first gas chamber, so by changing the internal volume of the second gas chamber by applying a small force to the movable member, the internal volume of the first gas chamber is changed, and the holding member can be driven in the gravity direction, and rigidity of the gas within the first gas chamber can be set high. Thus, by driving the movable member, the position of the object in the gravity direction can be controlled with a high response. Additionally, rigidity of the gas within the first gas chamber can be set high, so as an air cushion (air spring) the damping effects of high frequency vibrations such as a floor vibration become good.

Therefore, according to this aspect of the invention, a small and light vibration control device is obtained in which vibration removal or vibration control effects are preferable.

The adjusting device may comprise an electromagnetic actuator that drives the movable member.

The movable member may have a weight member that is lighter than the object.

The second gas chamber may comprise a tubular first cylinder and the movable member, which moves along an inner peripheral surface of the first cylinder. In this case, the adjusting device may include a gas pressure driving mechanism that drives the movable device through gas pressure that opposes the internal gas pressure of the second gas chamber.

In addition, the movable member may include a piston at an end portion that is opposite to the portion that moves along the inner peripheral surface of the first cylinder, and the gas pressure driving mechanism may include a second cylinder having an inner peripheral surface along which the piston moves and a gas supply mechanism that supplies gas into a gas chamber formed by the piston and the second cylinder. In this case, the second cylinder may be connected to the first cylinder.

The movable member may move via a gas hydrostatic pressure bearing.

The first gas chamber may include: (i) a tubular body attached to a base member so as to be tiltable about a fulcrum, and (ii) a holding member, which is arranged via a specified space on either an inner surface side or an outer surface side of the tubular body, and that is slidable along the tubular body, and has an inner bottom surface that serves as a pressure receiving surface that receives the pressure of the gas, and the holding member may be coupled in a state that allows pivoting with respect to the object. In this case, among the tubular body and the holding member, a tubular peripheral wall positioned on an inner peripheral side may have formed therein, at a specified spacing in a peripheral direction, a plurality of micro-apertures extending from the first gas chamber to the space.

The first gas chamber may be defined by a housing having an open top surface, and a holding member, which is connected to the open end portion of the housing via a first elastic member. In this case, a bottom wall of the housing may include first and second bottom wall members that oppose each other via a specified clearance, and an annular elastic member that connects the two bottom wall members and maintains the clearance. The bottom wall of the housing may include a frame-shaped member having an aperture in the center, a plate-shaped member arranged opposing a bottom surface side of the frame-shaped member via a specified clearance, and a gas hydrostatic pressure bearing provided between the frame-shaped member and the plate-shaped member and which maintains the specified clearance.

The holding member may include a stepped tubular first member connected to the open end portion of the housing via the first elastic member in a suspendedly supported state, and a second member having a pressure receiving portion connected to a bottom open end of the first member via an annular second elastic member and which receives, at a bottom end, internal air pressure of the first gas chamber. In addition, the second member may include: (i) a holding portion that holds the object outside the housing, (ii) the pressure receiving portion, and (iii) a shaft portion that connects the pressure receiving member and the holding member and extends through an interior of the first member in a vertical direction. In this case, the first member may include a first tubular body connected to the pressure receiving portion via the second elastic member and floatingly supported by the gas pressure along with the pressure receiving portion, and a second tubular body that has a lower end surface opposing an upper end surface of the first tubular body via a specified clearance, and having an upper end portion connected to the open upper end of the housing via the first elastic member. Furthermore, the first member may comprise a first tubular body that is connected to the pressure receiving portion via the second elastic member and is floatingly supported by the gas pressure along with the pressure receiving portion, and a second tubular body that opposes either an inner peripheral surface or an outer peripheral surface of the first tubular body via a specified clearance and has an upper end portion connected to the open end portion of the housing via the first elastic member.

In the latter case, among the first tubular body and the second tubular body, the one that is positioned on an outer peripheral side may have formed therein a micro aperture that extends through a wall at a position opposing the other one of the tubular bodies. Furthermore, a space between the first and second tubular bodies can also be used as an air duct of an air bearing.

According to another aspect of the invention, a vibration control device includes: a housing having an open top surface, a first tubular body supported at the open end portion of the housing via an annular first elastic member and extending in a vertical direction; a second tubular body positioned either inside or outside the first tubular body via a specified space and being relatively slidable with respect to the first tubular body; a movable member that is connected to a lower end of the second tubular body via an annular second elastic member, has a pressure receiving portion at a lower end, the pressure receiving portion, along with the first elastic member, the first tubular body and the second elastic member defining a gas chamber. The movable member is floatingly supported by gas pressure inside the gas chamber that acts on the bottom surface of the pressure receiving portion and has a top end portion that serves as a support portion that supports the object outside the housing from below.

According to this aspect of the invention, the first tubular body extending in a vertical direction is supported by the open end portion of the housing, of which the top surface is open, via an annular first elastic member, and the second tubular body is arranged either inside or outside of the first tubular body via a specified clearance and is relatively slidable with respect to the first tubular body. Additionally, a movable member which is defined as a support portion of which an upper end portion supports the object outside of the housing from below is connected to the lower end of the pressure receiving portion of the second tubular body via an annular second elastic member and is floatingly supported by a gas pressure within the gas chamber which acts on the bottom surface of the pressure receiving portion that, along with the housing, the first elastic member, the first tubular body, and the second elastic member, defines the gas chamber.

That is, the sliding member which supports the object from below is connected to the lower end of the second tubular body of the second elastic member through the pressure receiving portion of the lower end, so the degree of freedom in a tilting direction is high. Because of this, when the object is displaced in a horizontal direction, the movable member can be easily tilted. If the tilting angle is $\theta$ and $\theta$ is a micro-angle, according to a geometrical relationship, a vertical displacement amount (displacement amount within a horizontal plane) $\Delta$ of the support portion (and thus the object on the support portion) of the upper end of the sliding member is $\Delta$=(dimension of the sliding member in a height direction (distance between the support portion and the pressure receiving portion)) L×(tilting angle) $\theta$. Additionally, if the tilting angle $\theta$ exceeds a specified angle (angle which is allowed by rigidity of the second elastic member), the first and second tubular bodies are tilted along with the movable member, and according to the vertical displacement amount of the object, the second tubular body is slid with respect to the first tubular body. Because of this, the object can be moved in a horizontal direction without changing the height within a horizontal plane. Furthermore, the movement of the sliding member in a vertical direction can be easily accomplished as the second tubular body is slid with respect to the first tubular body. Therefore, the vibration control device will have low rigidity with respect to the six degrees-of-freedom directions of Z, X, Y, θx, θy, θz.

In other words, the vibration can be attenuated by the position change of the movable member, and control and removal of vibration of the object can be effectively performed. In this case, among the first and second tubular bodies, a tubular body positioned at an outer peripheral side may have formed therein, in a specified interval along a peripheral direction, micro apertures that connect the gas chamber and the space.

The first and second tubular bodies may comprise cylindrical tubular bodies, and the vibration control device may further comprise: a first support mechanism that includes: a first support member mounted on one side and another side of an upper end of the first tubular body; a support arm that is mounted on one side and another side of an open end portion of the housing and has a support point that supports the center of the first support member from below; and a coupling mechanism that integrally couples the first tubular body to the support arm at the support point in a manner that allows only rotation of the first tubular body; and a second support mechanism that includes a second support member mounted inside the second tubular body, and a coupling mechanism that couples the pressure receiving part of the movable member to the second support member at a coupling point at the center of the second support member in a manner that allows only rotation.

In this case, the coupling point may be set at a position that matches a rotational center of the second elastic member. An elastic urging member that urges the support arm in a direction that suppresses rotation of the first tubular body with respect to the support arm may be provided between the support arm and the first support member.

There may be further included an adjusting device that includes a separate chamber that is connected to the gas chamber and has a volume smaller than that of the gas chamber, the volume being variable by displacement of a movable member that forms part of the adjusting device, the position of the movable member in a gravity direction being adjusted by variation of the volume of the separate chamber and the gas chamber connected thereto according to positional variation of the movable member. In this case, according to the same reason as in the vibration control device of the first aspect of the invention, a small and light control device is possible.

The separate chamber may be formed by a cylindrical tubular cylinder and the movable member, which moves along an inner peripheral surface of the cylinder. The movable member may have a weight member that is lighter than the object. The adjustment device may include an electromagnetic actuator that drives the movable member.

Another aspect of the invention relates to a stage device comprising: a stage that is movable in a specified direction; a table arranged above the stage, and at least three vibration control devices according to any of the various aspects of the invention, and that holds the table above the stage.

Thus, a table can be held on a stage movable in a specified direction by three vibration control devices so the vibration of the table along with the movement of the stage can be controlled and minimized.

There may be further provided a first micro driving mechanism that micro-drives the table in a horizontal plane; and a second micro driving mechanism that micro-drives the table in a direction perpendicular to the horizontal plane and in an inclined direction with respect to the horizontal plane.

Another aspect of the invention relates to an exposure apparatus that exposes a photosensitive object through an energy beam and forms a specified pattern on the photosensitive object, comprising: at least three vibration control devices including the vibration control device according to any of the various aspects described above, and that holds at least a portion of the structural components that form the exposure apparatus main body by which the exposure is carried out at the at least three points.

Thus, at least part of the structural components forming the exposure apparatus main body can be held by three vibration control devices including at least the vibration control device with high vibration control effect, so the vibration of the exposure apparatus main body can be effectively controlled. Thus, the exposure accuracy can be maintained with high accuracy.

The exposure apparatus main body may include a mask stage that holds a mask in which is formed the pattern, an object stage on which the photosensitive object is mounted, and a body including a mask stage base on which is formed a movement surface of the mask stage and an object stage base on which is formed a movement surface of the object stage, and a portion of the body or all of the body may be held by the vibration control device.

The exposure apparatus main body may include a projection optical system that projects the energy beam, which has gone through the mask, onto the photosensitive object, the projection optical system being held by the vibration control device.

BRIEF DESCRIPTION OF THE DRAWINGS

The invention will be described in detail with reference to the following drawings, in which like reference numerals are used to identify similar elements, and wherein.

DETAILED DESCRIPTION OF PREFERRED EMBODIMENTS

First Embodiment

Figure 1:
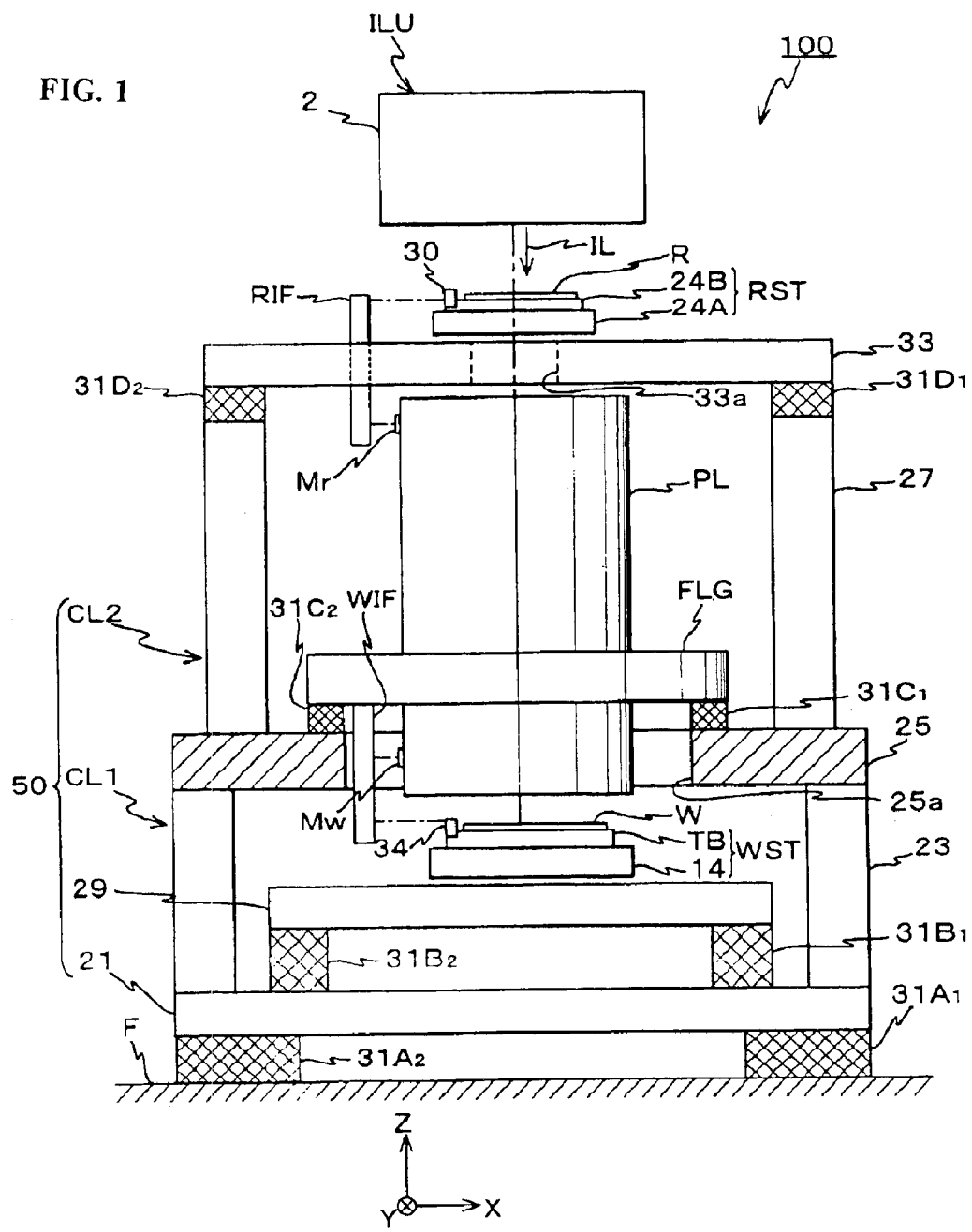
FIG. 1 is a schematic diagram showing an exposure apparatus of a first exemplary embodiment of the invention.

The following explains a first exemplary embodiment of this invention based on FIGS. 1–7(B). In FIG. 1, an overall structure of an exposure apparatus 100 of the first embodiment is schematically shown. This exposure apparatus 100 is a step-and-scan type scanning exposure apparatus, i.e., a so-called scanning stepper which synchronously moves a reticle R as a mask and a wafer W as a photosensitive object (or substrate) in a one-dimensional direction and transfers a circuit pattern formed in the reticle R to each shot region on the wafer W via a projection optical system PL.

The exposure apparatus 100 is provided with an illumination unit ILU which illuminates a slit-shaped rectangular illumination region on the reticle R with uniform irradiation by exposure illumination light (hereafter referred to as "illumination light") as an energy beam, a reticle stage RST as a mask stage holding the reticle R, a projection optical system PL which projects the illumination light IL emitted from the reticle R onto the wafer W, a wafer stage WST as an object stage which is movable within an XY plane while holding the wafer W, a body 50 on-which the projection optical system PL, the wafer stage WST, or the like is mounted, or the like.

The illumination unit ILU is connected to an undepicted light source via an undepicted light transmission optical system. As a light source, a far ultraviolet light source such as an ArF excimer laser (output wavelength: 193 nm), a KrF excimer laser (output wavelength: 248 nm), or the like, a vacuum ultraviolet light source such as an $F_2$ laser (output wavelength: 157 nm) or the like is used.

The illumination unit ILU is provided with an illumination system housing 2, and an illumination optical system which is formed to include an irradiation uniformizing optical system including, arranged within the illumination system housing 2 in a specified position relationship, e.g., an optical integrator, a relay lens, a variable ND filter, a variable field stop (also called a reticle blind or a masking blade), a dichroic mirror, and the like (all undepicted). Here, as an optical integrator, a fly eye lens, an internal surface reflective integrator (rod integrator or the like), a diffractive optical element, or the like can be used.

In the illumination unit ILU, which emits light onto the reticle R in which a circuit pattern or the like is drawn, a slit-shaped illumination region (a thin rectangular-shaped illumination region in an X axis direction) established by a reticle blind is illuminated as the illumination light IL with substantially uniform irradiation.

The reticle stage RST is arranged above a reticle stage fixing plate (or base) 33 which constitutes a top plate portion of a second column which will be described later. As shown in FIG. 1, the reticle stage RST is provided with a reticle scanning stage (or coarse movement stage) 24A which can be moved in a specified scanning direction (here, a Y axis direction which is a direction perpendicular to a paper plane in FIG. 1) with a specified stroke (a stroke in which the entire surface of the reticle R can cross at least the illumination light IL) along the top surface of the reticle stage fixing plate 33, and a reticle micro-moving stage (or fine movement stage) 24B which is arranged on the reticle scanning stage 24A, holds the reticle R, and can be micro-driven within the XY plane.

The reticle scanning stage 24A is floatingly supported above the top surface of the reticle stage fixing plate 33 by an undepicted non-contact bearing, e.g., a gas hydrostatic pressure bearing, via a clearance of, e.g., approximately several $\mu$m. This reticle scanning stage 24A is driven in a Y axis direction by an undepicted linear motor.

Figure 2:
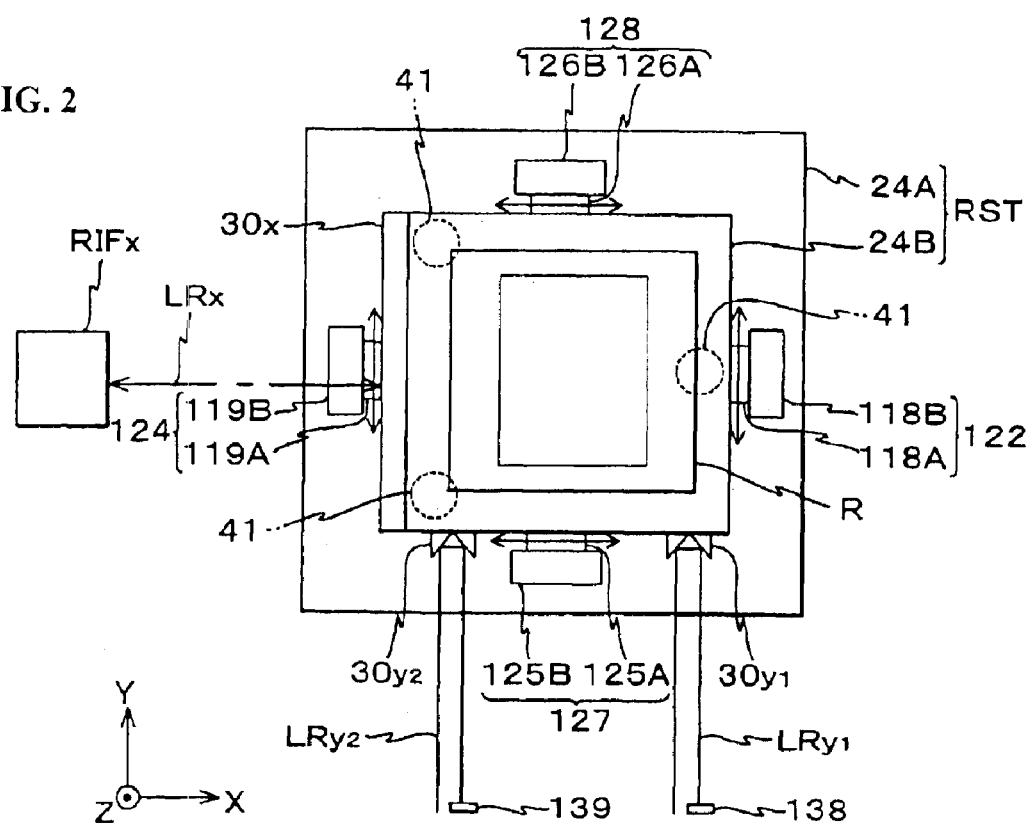
FIG. 2 is a plan view of a reticle stage shown in FIG. 1.

As shown in a plan view of FIG. 2, on one side (+X side), and another side (−X side) in the X axis direction of the reticle micro-moving stage 24B, voice coil motors 122 and 124 are respectively arranged. One voice coil motor 122 has a movable portion 118A arranged on a side surface of the +X side of the reticle micro-moving stage 24B and a stator 111B fixed to the top surface of the reticle scanning stage 24A facing the movable portion 118A. Another voice coil motor 124 has a movable portion 119A arranged on the side surface of the −X side of the reticle micro-moving stage 24B and a stator 119B fixed to the top surface of the reticle scanning stage 24A facing the movable portion 119A.

Furthermore, voice coil motors 127 and 128 are respectively arranged on one side (−Y side) and another side (+Y side) in the Y axis direction of the reticle micro-moving stage 24B. One voice coil motor 127 has a movable portion 125A arranged on the side surface of the −Y side of the reticle micro-moving stage 24B and a stator 125B fixed to the top surface of the reticle scanning stage 24A facing the movable portion 125A. Another voice coil motor 128 has a movable portion 126A arranged on the side surface of the +Y side of the reticle micro-moving stage 24B and a stator 126B fixed to the top portion of the reticle scanning stage 24A facing the movable portion 126A.

In this case, the reticle micro-moving stage 24B is micro-driven in the Y axis direction on the reticle scanning stage 24A by the voice coil motors 122 and 124, and is micro-driven in the X axis direction on the reticle scanning stage 24A by the voice coil motors 127 and 128. Furthermore, for example, by making a thrust generated by the voice motors 127 and 128 slightly different, the reticle micro-moving stage 24B can be micro-rotated in a θz direction (a rotation direction about the Z axis perpendicular to the XY plane). On the reticle micro-moving stage 24B, the reticle R is held by vacuum adsorption or the like.

As shown in FIG. 2, on the end portion of the −X side of the top surface of the reticle micro-moving stage 24B, an X axis moving mirror 30x formed of a flat mirror having a reflective surface perpendicular to the X axis is extendingly arranged in the Y axis direction. An interferometer beam (measurement beam) LRx in the measurement axis parallel to the X axis is irradiated from a reticle X interferometer RIF, to the moving mirror $30x$. A fixed mirror (reference mirror) which is a reference of the position measurement of the reticle X axis interferometer $RIF_x$ is arranged on the side surface of a lens barrel of the projection optical system PL. In the reticle X interferometer $RIF_x$, by receiving a reflected light beam from the moving mirror $30x$, and using the fixed mirror as a reference, the position in the X axis direction of the moving mirror $30x$, i.e., the position in the X axis direction of the reticle R is constantly detected at, e.g., approximately 0.5–1 nm resolution.

Furthermore, as shown in FIG. 2, on the side surface of the −Y side of the reticle micro-moving stage 24B, a pair of Y axis moving mirrors $30y_1$, $30y_2$ formed of corner cube type reflective members (e.g., a hollow retro reflector) are fixed, and interferometer beams $LRy_1$, $LRy_2$ of a measurement axis parallel to the Y axis are irradiated from an undepicted reticle Y interferometer to these moving mirrors $30y_1$, $30y_2$. The interferometer beams $LRy_1$, $LRy_2$ reflected by the moving mirrors $30y_1$, $30y_2$ are reflected by reflective mirrors 138, 138 which are fixed onto the reticle stage fixing plate 33, and return to an undepicted reticle Y interferometer. In the reticle Y interferometer, in the same manner as in the reticle X interferometer RIFx, by using a fixed mirror arranged on the side surface of the lens barrel of the projection optical system PL as a reference, the coordinate position in the Y axis direction of the reticle micro-moving stage 24B at an irradiation position of the respective interferometer beams $LRy_1$, $LRy_2$ is constantly independently detected at, e.g., approximately 0.5–1 nm resolution. Here, as a reticle Y interferometer, a double pass interferometer is used, and a measurement error is not generated by the effects of the rotation of the reticle micro-moving stage 24B.

The measurement values of the reticle X interferometer RIFx and the reticle Y interferometer are supplied to an undepicted stage control device. The stage control device detects the position information in the X axis direction of the reticle micro-moving stage 24B based on the coordinate value x measured by the reticle X interferometer $30x$ using, e.g., an interferometer beam LRx. Furthermore, the stage control device calculates the position information in the Y axis direction of the reticle micro-moving stage 24B based on the average value $(y_1+y_2)/2$ of the coordinate values $y_1$ and $y_2$ measured by the pair of Y axis interferometers using the interferometer beams $LRy_1$ and $LRy_2$. Additionally, the stage control device calculates the position information in the rotation direction (θz direction) of the reticle micro-moving stage 24B, e.g., based on the difference between the coordinate values $y_1$ and $y_2$. The position information in the X, Y and θz directions of the reticle micro-moving stage 24B detected by the stage control device is output to a main control device.

As described above, on the reticle micro-moving stage 24B, a total of three mirrors, i.e., the X axis moving mirror $30x$ and the Y axis moving mirrors $30y_1$ and $30y_2$ are arranged. According to this, a plurality of fixed mirrors and laser interferometers are also arranged. However, for simplicity, in FIG. 1 they are shown as a single moving mirror 30, a fixed mirror Mr, and a reticle interferometer RIF, respectively. Furthermore, by mirror-finishing the end surfaces of the reticle micro-moving stage 24B, the reflective surfaces of the laser interferometer (corresponding to the reflective surfaces of the moving mirrors $30x$, $30y_1$, $30y_2$) can also be formed.

The projection optical system PL is inserted from above into an aperture 25a formed in the center of a lens barrel fixing plate 25 constituting a first column which will be described later. A flange portion FLG is arranged at a position slightly lower than the center, in the height direction, of the lens barrel portion of the projection optical system PL, and the projection optical system PL is supported by three vibration control devices $31C_1$–$31C_3$ (the vibration control device $31C_3$ on the far side of the paper plane of FIG. 1 is not depicted) arranged on the lens barrel fixing plate 25 via the flange portion FLG. Furthermore, the structure of the vibration control devices $31C_1$–$31C_3$ will be described later.

As the projection optical system PL, in a both-side-telecentric reduction system, a dioptric system (i.e., an all-refractive system) is used which is formed of a plurality of lens elements having a common optical axis AX in the Z axis direction. The projection magnification of the projection optical system PL is, for example, ¼, ⅕, or ⅙. Because of this, if the illumination region on the reticle R is illuminated by the illumination light 1L from the illumination unit ILU, a reduced image (which also is inverted) of a circuit pattern within the illumination region of the reticle R is formed in a slit-shaped projection region, that is, an exposure region conjugate to the illumination region on the wafer W, which is coated by a photoresist, via the projection optical system PL.

As shown in FIG. 1, the wafer stage WST is arranged above the wafer stage fixing (or base) plate 29 arranged under the projection optical system fixing plate 25. The wafer stage WST holds the wafer W and moves within the XY plane.

The wafer stage WST is provided with, for example, an XY stage 14 as a stage which can be freely driven within the XY plane by a wafer stage driving portion formed of an air floating type or a magnetic floating type two-dimensional linear actuator or the like and a wafer table TB as a table mounted on the XY stage 14. On the wafer table TB, an undepicted wafer holder is fixed by vacuum adsorption, and the wafer W is adsorbed and fixed on the wafer holder via an undepicted vacuum chuck, an electrostatic chuck, or the like.

Figure 3A:
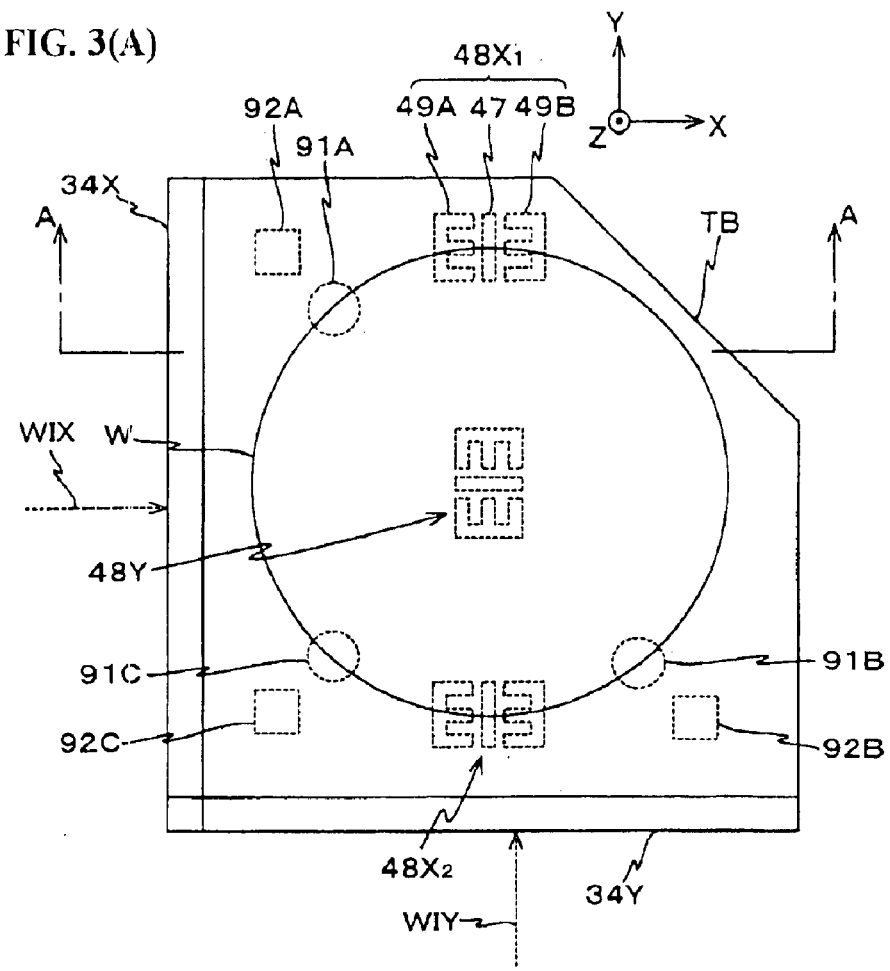
FIG. 3(A) is a plan view of a wafer stage WST shown in FIG. 1.
Figure 3B:
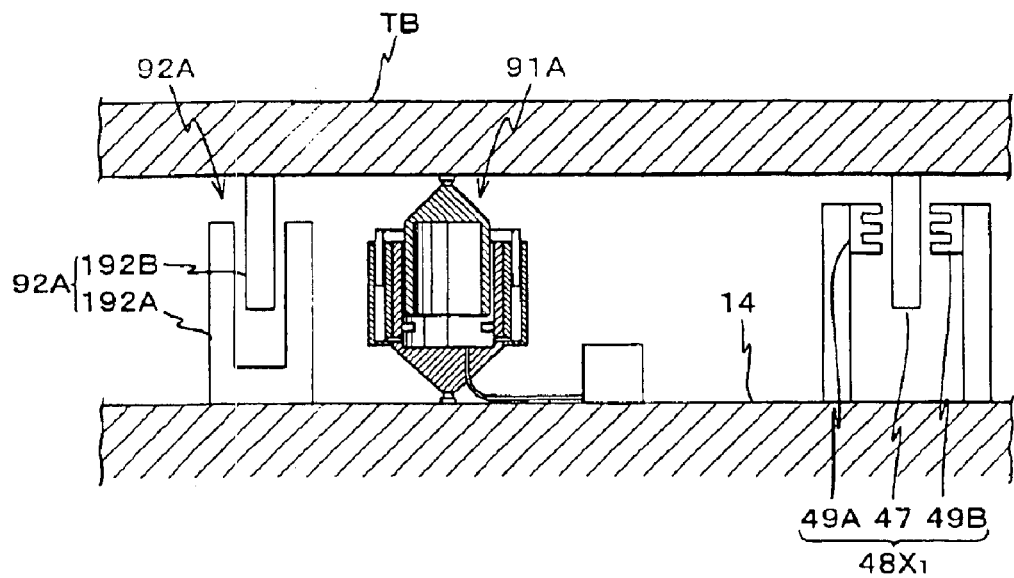
FIG. 3(B) is a cross sectional view of FIG. 3(A) taken at line A—A.

FIG. 3(A) shows a schematic plan view of the wafer table TB constituting the wafer stage WST. FIG. 3(B) shows a cross-sectional view through line A—A of FIG. 3(A).

As is clear from FIGS. 3(A) and (B), between the XY stage 14 and the wafer table TB, three EI cores $48X_1$, 48Y, $48X_2$ are arranged at a specified interval in the Y axis direction. The EI cores $48X_1$, $48X_2$ on both ends drive in the X axis direction, and the center EI core 48Y drives in the Y axis direction.

As shown in FIG. 3(B), the EI core $48X_1$ has an iron plate 47 projecting downward from the bottom surface of the wafer table TB and a pair of electromagnets 49A, 49B arranged in a state opposing each other via the iron plate 47 and fixed to the XY stage 14. Based on the supply electric current (driving electric current), which creates a driving force having a direction and size corresponding to the difference between the magnetic attraction force generated by the respective electromagnets 49A and 49B, the wafer table TB is driven in the X axis direction via the iron plate 47. EI core $48X_2$ is constituted in the same manner as in the EI core $48X_1$, and in the same manner, generates a driving force which drives the wafer table TB in the X axis direction.

The remaining EI core 48Y is arranged in the substantially center position between the EI cores $48X_1$, $48X_2$ and is constituted in the same manner as the EI core $48X_1$. However, the EI core 48Y generates a driving force which drives the wafer table TB in the Y axis direction according to the driving electric current supplied to its pair of electromagnets.

In this embodiment, based on the instructions of the main control device, as an undepicted stage control device individually controls a driving electric current for the EI cores $48X_1$, $48X_2$, the driving amount of the X axis direction of the wafer table TB is controlled. At the same time, by making the driving force of the X axis direction generated by the EI cores $48X_1$, $48X_2$ different, the θz rotation of the wafer table TB can be controlled. Furthermore, based on the instructions of the main control device, an undepicted stage control device micro-drives the wafer table TB in the Y axis direction by controlling the driving electric current for the EI core 48Y.

Furthermore, as is clear from FIGS. 3(A) and (B), between the XY stage 14 and the wafer table TB, at a position of each vertex of a right triangle as seen from a plan view (seen from the top), three voice coil motors 92A–92C as second micro-moving mechanisms are respectively arranged. As shown in FIG. 3(B), the voice coil motor 92A is provided with a movable portion 192B formed of, for example, a magnetic pole unit fixed to the bottom surface of the wafer table TB, and a stator formed of, for example, a substantially U-shaped armature unit fixed to the top surface of the XY stage 14. According to the driving electric current to be supplied to the armature unit, the voice coil motor 92A generates a driving force (electromagnetic force) which drives the movable portion 192B in the Z axis direction. The voice coil motors 92B, 92C are constituted in the same manner as the voice coil motor 92A and generate a driving force which drives the respective movable portions in the Z axis direction. In this embodiment, based on the instructions of the main control device, an undepicted stage control device independently controls a driving electric current supplied to the armature unit of the voice coil motors 92A–92C to cause the wafer table TB to be micro-driven in the Z axis direction and in an inclination direction (the rotation direction (θx direction) about the X axis and the rotation direction (θy direction) about the Y axis) with respect to the XY plane.

Additionally, as is clear from FIGS. 3(A) and (B), between the XY stage 14 and the wafer table TB, three vibration control devices 91A–91C are respectively arranged in the vicinity of the respective voice coil motors 92A–92C. The wafer table TB is supported by the three vibration control devices 91A–91C on the XY stage 14. The detailed structure or the like of the vibration control devices 91A–91C will be described later.

As shown in FIG. 3(A), on the end portion of the −X side of the top surface of the wafer table TB, a moving mirror 34x is arranged and extends in the Y axis direction. On the end portion of the −Y side, a moving mirror 34Y is arranged and extends in the X axis direction. Measurement beams WIX, WIY (see FIG. 3(A)) are respectively irradiated from a wafer interferometer WIF (see FIG. 1), which is supported suspended from the flange FLG of the projection optical system PL, to these moving mirrors 34X and 34Y. In actuality, with respect to the wafer interferometer, a wafer X interferometer for the X direction position measurement and a wafer Y interferometer for the Y direction position measurement are arranged. The moving mirrors 34X, 34Y are arranged correspondingly on the wafer stage WST. Furthermore, according to this, the wafer X fixed mirror and the wafer Y fixed mirror are arranged on the lens barrel portion of the projection optical system PL. In FIG. 1, there are shown as the wafer interferometer WIF, the moving mirror 34, and a fixed mirror Mw, respectively.

By using the wafer interferometer WIF, the position information in the X axis direction and in the Y axis direction of the wafer table TB is constantly detected at, e.g., approximately 0.5–1 nm resolution by using the fixed mirror as a reference. In addition, the wafer X interferometer and the wafer Y interferometer are constituted by multi-axis interferometers having a plurality of measurement axes. In addition to the X and Y position of the wafer table TB, the rotation (yawing (θz rotation about the Z axis), pitching (θx rotation about the X axis), and rolling (θy rotation about the Y axis)) can also be measured. Furthermore, by mirror-finishing the end surface of the wafer table TB, the reflective surface (corresponding to the reflective surface of the moving mirrors 34X, 34Y) can also be formed.

The position information (or speed information) of the wafer stage WST measured by the wafer interferometer WIF is sent to an undepicted stage control device and the main control device via the stage control device. The stage control device controls the movement of the wafer stage WST within the XY plane via the wafer stage driving portion based on the output of the wafer interferometer WIF so that the position information (or speed information) output from the wafer interferometer WIF basically matches a command value (target position, target speed) given by the main control device.

As shown in FIG. 1, the main body column 50 is provided with a base plate 21 which is horizontally supported via the three vibration control devices $31A_1$–$31A_3$ (in FIG. 1, the vibration control device $31A_3$ on the far side of the paper plane is not depicted) on the floor surface F, a first column CL1 arranged on the base plate 21, a second column CL2 arranged above the first column CL1, and the wafer stage fixing plate 29 as an object stage base which is horizontally supported by the three vibration control devices $31B_1$–$31B_3$ (in FIG. 1, the vibration control device $31B_3$ on the far side of the paper plane is not depicted) on the base plate 21, or the like.

The first column CL1 is arranged on the base plate 21 and is provided with the lens barrel fixing plate (main frame) 25 supported by the three support columns 23 (in FIG. 1, the support column on the far side of the paper plane is not depicted).

The second column CL2 has three support columns 27 (in FIG. 1, the support column on the far side of the paper plane is not depicted) arranged in a state surrounding the projection optical system PL on the lens barrel fixing plate 25 and the reticle stage fixing plate 33 as a mask stage base which is substantially horizontally supported via the respective vibration control devices $31D_1$–$31D_3$ on the respective support columns 27.

Additionally, although it is not depicted, in the exposure apparatus 100, for example, as disclosed in Japanese Laid-Open Patent Publication 6-283403, a diagonally incident type multi-point focus position detecting system is arranged which detects the position in the Z axis direction (optical axis AX direction) of the portion of the surface of the wafer W that is within the exposure region, and of the region in the vicinity of the exposure region. Focus leveling control of the wafer W is performed by an undepicted main control device during the scanning exposure, which will be described later.

Figure 4:
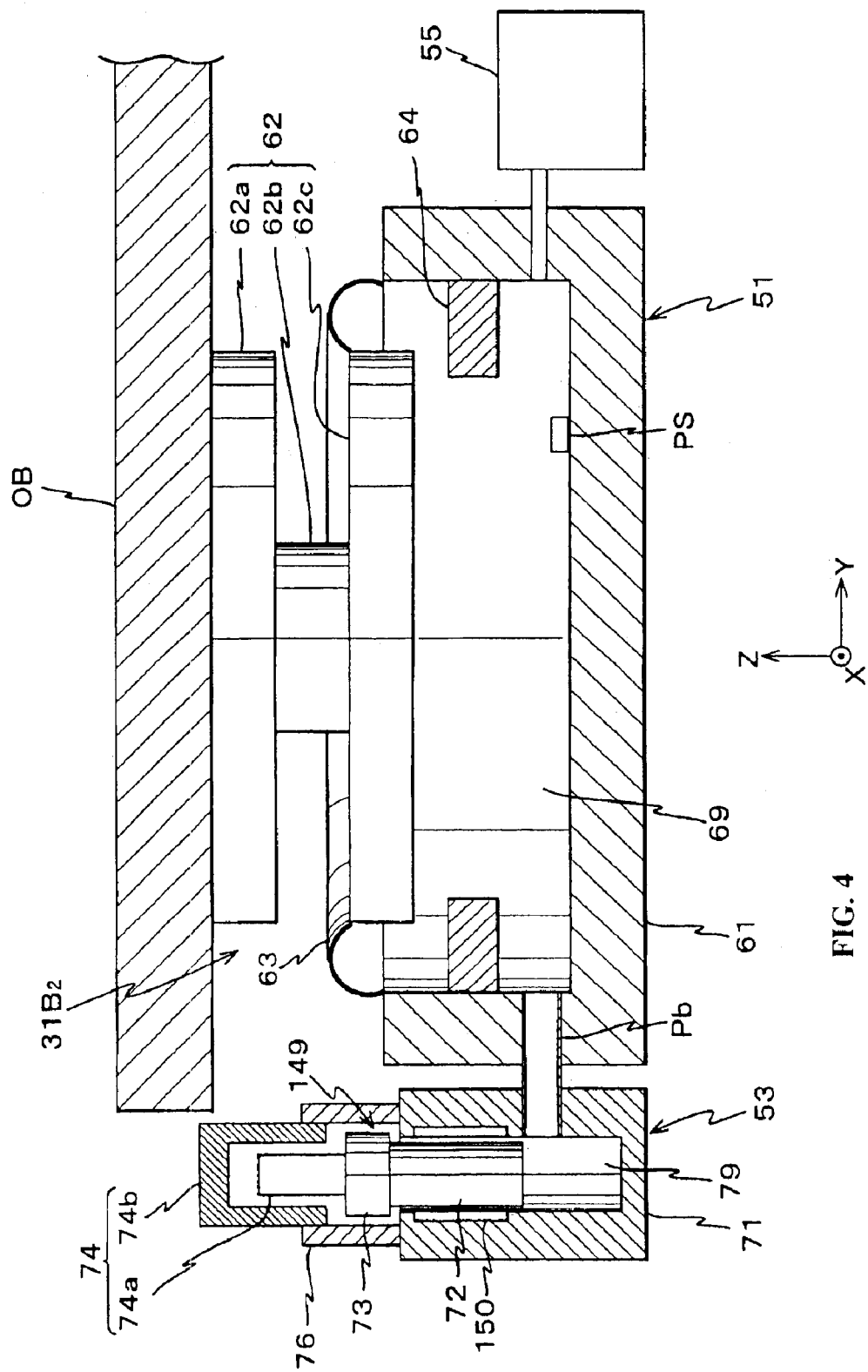
FIG. 4 shows a cross sectional view of a vibration control device used for supporting a body.
Figure 5:
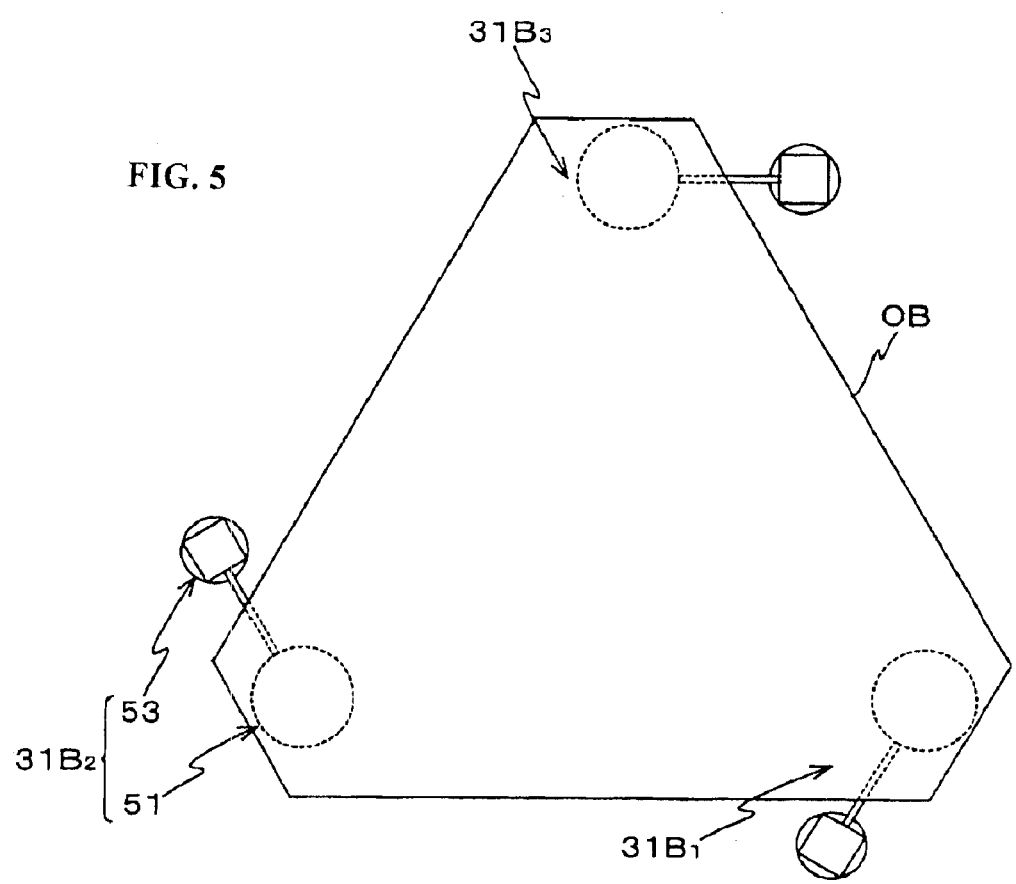
FIG. 5 is a plan view showing a state in which the structure is supported at three points by the vibration control device.

The following explains the vibration control devices arranged in the respective portions of the exposure device 100 in detail based on FIGS. 4 and 5. As an example, the vibration control device $31B_2$ is described, which is one of the three vibration control devices $31B_1$–$31B_3$ supporting the wafer stage fixing plate 29.

FIG. 4 shows a cross-sectional view of the structure of the vibration control device $31B_2$. The vibration control device $31B_2$ is provided with an air mount portion 51 which supports a support target object OB as an object (the support target object OB is a wafer stage fixing plate 29 in this case, and if there is a mounted object, this corresponds to the wafer stage fixing plate 29 and the mounted object) from below, a piston mechanism 53 which is arranged in the vicinity of the air mount portion 51 and has a second gas chamber 79 as a separate chamber which is connected to a first gas chamber 69 formed inside of the air mount portion 51 through a tube Pb, and an electromagnetic regulator 55 which adjusts gas, e.g., an air pressure filled within the first and second gas chambers 69 and 79, respectively. In this case, as shown in FIG. 5, as an example, the support target object OB is supported from below at vertex positions of a substantially equilateral triangle by the three vibration control devices $31B_1$–$31B_3$.

The air mount portion 51 is provided with a cylindrical housing 61 in which only the top surface is opened, and a holding member 62 connected to the aperture in the top portion of the housing 61 via a diaphragm 63 as a first elastic member and positioned inside of the top portion aperture. The diaphragm 63 has a shape in which a circular-shaped (donut-shaped) member whose cross section is formed of a circular tubular member formed of, for example, rubber or another material having substantially the same elasticity is divided into two substantially equal parts along a cross section perpendicular to an annular center axis so that the cross section of the tube-shaped member becomes a semicircle. With respect to the diaphragm 63, the outer periphery is connected to the periphery of the top portion aperture of the housing 61, and the inner periphery is connected to the outer periphery of a disk-shaped pressure receiving portion 62c constituting the lower end portion of the holding member 62. In this case, the first gas chamber 69 formed of a substantially airtight space within the housing 61 is formed by the housing 61, the diaphragm 63, and the holding member. The holding member 62 is supported by a gas pressure such as air within the first gas chamber 69 at a specified position (hereafter referred to as "gas pressure within the first gas chamber 69" or "internal pressure of the first gas chamber 69").

The diaphragm 63 has a characteristic that rigidity in the Z axis direction and the tilting direction (θx and θy directions) is low and rigidity in a horizontal direction (mainly X and Y directions) is high. By doing this, in a state in which the first gas chamber 69 maintains air tightness, the holding member 62 can be flexibly moved in the Z axis direction and the tilting direction.

In substantially the center of the height direction (Z axis direction) of the inner circumferential surface of the housing 61, for example, even in a state in which a gas pressure within the first gas chamber 69 is made to be substantially zero during maintenance or the like, a plurality of stoppers 64 are protrudingly arranged which prevent the holding member 62 from contacting the internal bottom surface of the housing 61 (prevent the holding member 62 from completely falling into the housing 61). Furthermore, in the internal bottom surface of the housing 61, a pressure sensor PS is arranged which measures a pressure of the internal gas of the first gas chamber 69.

The holding member 62 has the disk-shaped pressure receiving portion 62c, a shaft portion 62b in which the lower end is fixed to the top surface of the pressure receiving portion 62c, and a disk-shaped holding portion 62a which is the same as the pressure receiving portion 62c in which the lower surface is fixed to the top end of the shaft portion 62b. The support target object OB is mounted on the top surface of the holding portion 62a.

The piston mechanism 53 is provided with a cylinder 71 as a first cylinder formed of a tubular body extending in a vertical direction (gravity direction) and in which the top surface is opened and the bottom surface is closed, and a movable member 149 slidable in the gravity direction along the inner circumferential surface of the cylinder 71.

Part of the peripheral wall of the cylinder 71 has an aperture, and one end of the tube Pb is connected to the aperture. The other end of the tube Pb is connected to the housing 61. The movable member 149 is provided with a tubular piston member 72 inserted into the cylinder 71, a weight member 73 fixed to the top surface of the piston member 72, and an armature unit 74a which houses an armature coil fixed to the top surface of the weight member 73.

The armature unit 74a constitutes a movable portion of the voice coil motor 74 which is a type of electromagnetic actuator. Hereafter, the armature unit 74a is also described as the movable portion 74a.

A stator 74b which, along with the armature unit 74a, forms a magnetic pole unit constituting the voice coil motor 74 is fixed to the upper end surface of the cylinder 71 via a pair of support members 76.

A plurality of gas hydrostatic pressure bearings (e.g., air bearings are used, so hereafter referred to as "air bearings") 150 are arranged in the outer circumferential surface of the piston member 72. According to the air bearings 150, as a pressurized air is emitted from each air bearing 150, the space (clearance) between the cylinder 71 and the piston member 72 maintains a substantially uniform dimension across the entire circumference, and the space (second gas chamber) 79 within the cylinder 71 is maintained substantially airtight.

The weight member 73 has a mass which is substantially balanced with one-third of the total weight of the support target object OB supported by the air mount portion 51 of the vibration control device $31B_2$. This will be further described later.

An undepicted electric current supply source is connected to the movable portion 74a of the voice coil motor 74, and according to the electric current supplied from the electric current supply source to the movable portion 74a, the movable member 149 including the movable portion 74a is driven in the Z axis direction. The height direction position of the movable member 149 is measured by a piston position measurement sensor formed of a linear encoder or the like. In this embodiment, based on the measurement value of the piston position measurement sensor, an undepicted stage control device controls an electric current supplied from the electric current supply source to the movable portion 74a.

Based on the measurement result of the pressure sensor PS, under the direction of an undepicted main control device, the electromagnetic regulator 55 is controlled by the stage control device, and the supply air amount (and the pressure) is adjusted so that an air pressure within the first gas chamber 69 and the second gas chamber 79 connected to the first gas chamber 69 is maintained at a specified pressure value.

The remainder of the vibration control devices $31B_1$, $31B_3$ are constituted in the same manner as the vibration control device $31B_2$.

The support target object OB supported by the vibration control devices $3 IB_1$–$3 IB_3$ which were thus constituted, i.e., the wafer stage fixing plate 29, has a vibration sensor such as an accelerometer. Furthermore, it is desirable that the interval between the wafer stage fixing plate 29 and the base plate 21 is measured by using an undepicted displacement sensor.

In this case, for example, micro-vibration (external vibration), which is a high frequency vibration from the floor surface F side, is insulated by an air damping force (elasticity of an air spring constituted by the air mount portion 51) within the first gas chamber 69 which constitutes the vibration control devices $31B_1$–$31B_3$, respectively, at, for example, a micro G level.

Furthermore, for example, if a significant force affects one of the vibration control devices $31B_1$–$31B_3$ due to an offset load generated in the wafer stage fixing plate 29 by the movement of the wafer stage WST and/or vibration of a low frequency is generated, based on the measurement value of the vibration sensor or the displacement sensor, the stage control device controls the voice coil motor 74, drives the movable member 149 in the Z axis direction, and changes the internal volume of the second gas chamber 79. By so doing, the internal volume of the first gas chamber 69 changes, the holding member 62 is displaced in a vertical direction, and the effects due to the offset load or the low frequency vibration is removed.

Additionally, if vibration of a medium frequency higher than the low frequency vibration, but lower than the external vibration, is generated in the wafer stage fixing plate 29 due to the reaction force during the acceleration and deceleration of the wafer stage WST, based on the measurement value of the vibration sensor, the stage control device controls the voice coil motor 74 at a high speed, and the internal volume of the second gas chamber 79 is increased or decreased. Thereby, the internal volume of the first gas chamber 69 is increased or decreased, the holding member 62 oscillatingly changes in a vertical direction, and the vibration is promptly attenuated.

Thus, in the vibration control devices $31B_1$–$31B_3$, by using the voice coil motor 74 and driving the movable member 149 in the vertical direction, the position control of the gravity direction of the holding member 62 can be performed with a high response.

Thus, in the vibration control devices $31B_1$–$31B_3$, a pressure of gas (air) within the space formed of the first and second gas chambers 69 and 79, respectively, and the internal space of the tube Pb connecting the first and second gas chambers 69 and 79, respectively, is maintained at a constant pressure, and without changing the air pressure, by the position change of the movable member 149, the position in the gravity direction of the holding member 62 and the support target object OB supported by the holding member 62 is controlled. Because of this, it is not necessary to provide a very large internal volume of the first gas chamber 69, so a smaller and lighter vibration control device can be accomplished. This is because, even if an air spring has high rigidity, the holding member 62 itself accomplishes extremely low rigidity in the Z axis direction and in the tilting direction, and vibration or the like from the floor is transmitted to the piston mechanism 53 side by such high rigidity, and the vibration can be effectively controlled by the up and down movement of the movable member 149 of the piston mechanism 53. Thus, it is desirable that a cross-sectional area of the tube Pb should be maximized so that the pressure of the first and second gas chambers 69 and 79 can be respectively maintained at a constant pressure via the tube Pb. If the cross-sectional area of the tube Pb is small, a pressure difference may be generated between the gas chambers 69 and 79, and high speed controllability of the voice coil motor 74 deteriorates. Furthermore, the best method is to use a structure in which the gas chambers are used as a common space (i.e., a structure which does not go through the tube Pb). In this case, a pressure difference is not generated in the gas chambers.

Vibration to be transmitted to the support target object OB from the floor surface due to the rigidity of the diaphragm 63 itself can be measured in advance, and that vibration can be positively controlled by the voice coil motor 74. By so doing, substantially all vibrations can be prevented from being transmitted to the support target object OB.

Furthermore, as shown in FIG. 5, the piston mechanism 53 can be provided at an external portion of the support target object OB and can be arranged at an arbitrary position, so the degree of freedom of arrangement can be improved, and a space can be effectively used. Thus, this will contribute to the foot print reduction of the device.

Furthermore, the voice coil motor 74 does not directly drive the support target object OB, but the position of the holding member 62 of the air mount portion 51 is moved by the driving of the voice coil motor 74, that is, the voice coil motor 74 and the air mount portion 51 are connected in series. In other words, there is only one point of application of the force with respect to the support target object OB. Because of this, unlike the conventional vibration control device, distortion is not generated in the support target object OB by the interaction of the driving force of the voice coil motor 74.

Furthermore, in the piston mechanism 53, gas leaking from the portion where the air bearing is arranged is set to be sufficiently small. However, by also considering leaking gas amount, the air pressure within the space formed of the first and second gas chambers 69 and 79 of the vibration control device 31 and the internal space of the tube Pb connecting the first and second gas chambers 69 and 79 can be controlled via the electromagnetic regulator 55.

Furthermore, in the piston mechanism 53, in piston member 72, the pressure of the internal gas of the second gas chamber 79 is mainly operated in the Z axis direction, so the air bearing between the cylinder 71 and the piston member 72 does not have to have high rigidity. When a force in the tilting direction acts on the piston due to the decentering of the pressure center, rigidity is sufficient to prevent collision of the piston member 72 and the cylinder 71.

Other vibration control devices $31A_1$–$31A_3$, $31C_1$–$31C_3$, and $31D_1$–$31D_3$ are constituted in the same manner as the above-mentioned vibration control devices $31B_1$–$31B_3$, although the support target object OB is different.

For example, in the case of the vibration control devices $31A_1$–$31A_3$ supporting the entire mounted object and the body 50, as shown in FIG. 5 the support target object OB with a total mass of approximately 10 tons=10,000 kg needs to be supported at three points. Therefore, the mass received by the vibration control devices $31A_1$–$31A_3$ is approximately 3.3 tons.

If the diameter of the bottom surface (pressure receiving surface) of the pressure receiving portion 62c of the holding member 62 constituting each air mount portion 51 of the vibration control devices $31A_1$–$31A_3$ is approximately 300 mm, and if the diameter of the bottom surface of the piston member 72 constituting the piston mechanism 53 is approximately 30 mm, by fixing the weight member 73 to have a mass of approximately 33 kg, which is 1/100 of 3.3 tons, onto the piston member 72, the air mount portion 51 can be balanced with the piston mechanism 53.

In this case, if the support target object OB is displaced by, for example, 1 μm in the Z axis direction by the vibration of the floor surface where the vibration control device is mounted, by driving the movable member 149 for 100 μm in a direction whereby the displacement is cancelled by the voice coil motor 74, in a state where the pressure of the internal gas within the first and second gas chambers 69 and 79, respectively, is maintained, it is possible to prevent vibration from being transmitted from the floor surface to the support target object OB. Furthermore, an undepicted vibration sensor may be arranged on the floor surface, and a voice coil motor 74 may be controlled based on the measurement value of the acceleration sensor, so the transmission of the vibration of the floor surface to the support target object OB, i.e., the body 50 and the entire mounted object, can be effectively controlled.

Furthermore, according to the vibration control devices $31C_1$–$31C_3$, in the same manner as in the vibration control devices $31B_1$–$31B_3$, micro-vibration from the floor surface F side (including returned vibration), vibration due to the reaction force by the driving of the wafer stage WST, and vibration due to the reaction force by the driving of the reticle stage RST can be effectively controlled so as not to be transmitted to the projection optical system PL as the support target object OB via the respective portions of the body 50.

Furthermore, according to the vibration control devices $31D_1$–$31D_3$, in the same manner as in the vibration control devices $31B_1$–$31B_3$, micro-vibration from the floor surface F side (including returned vibration) and vibration due to the reaction force by the driving of the wafer stage WST can be effectively controlled so as not to be transmitted to the reticle stage fixing plate 33 as the support target object OB via the respective portions of the body 50. At the same time, vibration due to the reaction force by the driving of the reticle stage RST can be effectively controlled so as not to be transmitted to the projection optical system PL via the respective portions of the body 50.

Figure 6A:
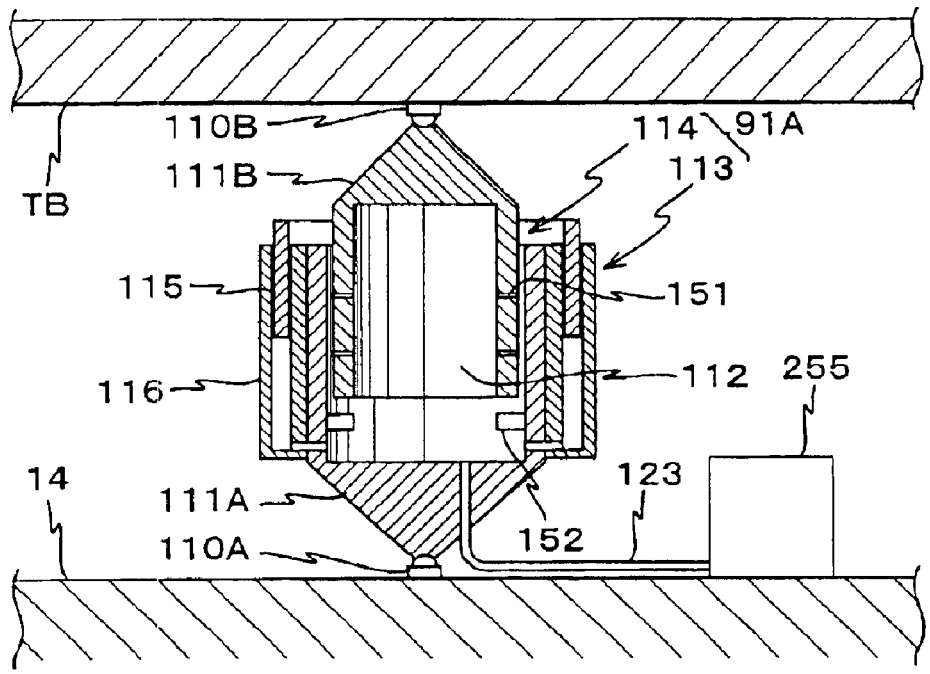
FIG. 6(A) is a cross sectional view showing a structure of the vibration control device used in a wafer stage.

The following explains the vibration control devices 91A–91C supporting the wafer table TB on the XY stage 14 by using the vibration control device 91A as an example based on FIGS. 6(A) and (B).

As shown in FIG. 6(A), the vibration control device 91A is provided with an air mount portion 114 having a first tubular body 111A as a tubular body formed of a tubular body having an upper end portion that is open and a lower end that is connected to the top surface of the XY stage 14 via a ball joint 110A, and a second tubular body 111B formed of a tubular body having an open lower end inserted into the first tubular body 111A from the upper direction and an upper end that is connected to the lower surface of the wafer table TB via the ball joint 110B, and a piston mechanism 113 arranged in the peripheral portion of the first tubular body 111A.

The first tubular body 111A is formed of a tubular body in which the outer shape of the lower end portion connected to the ball joint 110A is conical-shaped and the upper portion of the conical portion is a cylindrical portion. The second tubular body 111B is formed of a tubular body in which the outer shape of the top end portion connected to the ball joint 110B is conical and the lower portion is tubular. Furthermore, the second tubular body 110B is inserted into the first tubular body 111A, forming a first gas chamber 112 in which gas, e.g., air, is filled.

The piston mechanism 113 is provided with a cylinder 116 formed of a double tubular body having an upper end surface that is open and which contacts and is fixed to the peripheral portion of the first cylindrical 111A, and a piston member 115 formed of a cylindrical member inserted into the internal space of the cylinder 116 from above via the top portion aperture of the cylinder 116.

The internal space of the cylinder 116 is defined as a second gas chamber connected to the first gas chamber 112 via an air flow path.

Furthermore, in the piston member 115, in the same manner as in the vibration control devices $31A_1$–$31D_3$, a weight member can also be arranged. Here, the piston member 115 is constituted by a relatively heavy member, and because of its mass, the wafer table TB and the object mounted thereon are balanced.

Gas, for example air, is filled in the first gas chamber 112. The gas pressure, that is, the internal pressure of the first gas chamber 112 is set at a specified pressure by an electromagnetic regulator 255 connected to the first tubular body 111A via a tube 123. Here, a specified pressure is set at a pressure which can support the wafer table TB by the three vibration control devices 91A–91C.

Furthermore, in the vibration control device 91A, a plurality of air holes 151 are formed at a specified interval along the entire peripheral wall of the second tubular body 111B. An internal gas with high pressure from the first gas chamber 112 flows into a space between the first and second cylindrical bodies 111A and 111B, respectively, via the air holes 151. By so doing, the second tubular body 111B functions as a type of gas hydrostatic pressure bearing (air bearing). Therefore, hereafter, the air holes 151 are also described as gas hydrostatic pressure bearings 151.

Also, in this vibration control device 91A, a plurality of stoppers 152 are arranged on the inner surface of the peripheral wall of the first tubular body 111A. In the vibration control device 91A, the second tubular body 111B is also used as a holding member.

The wafer table TB is supported at three points on the XY stage 14 by the vibration control devices 91A–91C which were thus structured, so the wafer table TB can be driven in a state where resistance is substantially zero with respect to any of the six degrees-of-freedom directions of X, Y, Z, θx, θy, θz.

Figure 6B:
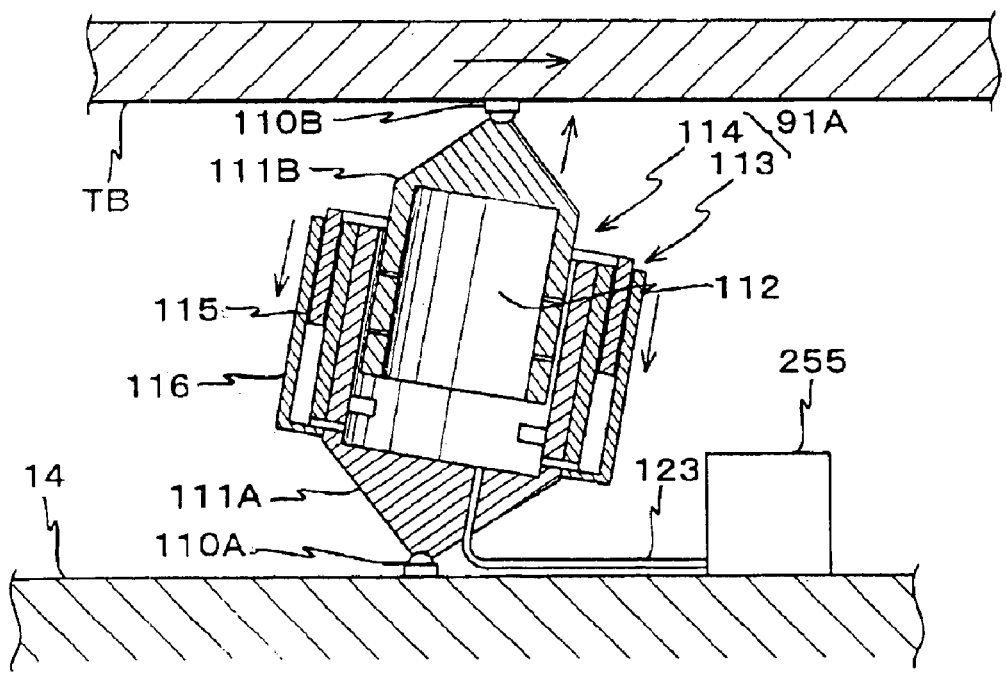
FIG. 6(B) shows a stage of the vibration control device when the wafer stage moves to the right side of the figure.

If the wafer table TB is moved in a right direction within a paper plane of FIG. 6(B), as shown in FIG. 6(B), the second tubular body 111B moves in an upper direction within the paper plane, the entire length of the air mount portion 114 is extended, and the volume of the first gas chamber 112 increases. According to this state, in the piston mechanism 113, the piston member 115 moves in a direction which reduces the internal volume of the second gas chamber (lower direction within the paper plane). Because of this, rigidity of the horizontal direction (X, Y, θz directions) of the vibration control device 91A (and 91B, 91C) can be reduced (substantially to zero). In this case, the movement of the wafer table TB in the horizontal direction can be controlled by the EI cores $48X_1$, $48X_2$, $48Y$, so the air mount portion 114 can be prevented from completely falling over in a horizontal direction.

With respect to the Z, θx, θy directions of the vibration control device 91A (and 91B, 91C), the rigidity can be reduced (substantially to zero). This is clear from the characteristics of the structure, in which extension and contraction of the air mount portion 114 and the up and down movement of the ball joint is possible; thus, no further explanation is needed or provided.

Additionally, in this case, the wafer table TB is controlled by the voice coil motors 92A–92C and the EI cores $48X_1$, $48X_2$, $48Y$ with a high response in the six degrees-of-freedom directions, so the vibration control devices 91A–91C only need to support the mass of the wafer table TB itself, and it is more desirable that the vibration control devices 91A–91C themselves have low rigidity.

Furthermore, in the vibration control devices 91A–91C, the center axis of the air mount portion 114 formed by the first and second tubular bodies 111A and 111B matches the center axis of the piston mechanism 113, so a good vibration control device with good space efficiency is accomplished.

In this embodiment, according to an area ratio between the internal bottom surface of the second tubular body 116 and the end surface (pressure receiving surface) of the piston member 115, the mass of the piston member 115 itself (the mass of the weight member fixed to the piston member 115) is set so that the wafer table TB can be held at a specified Z position in a reference state in which the wafer W is adsorbed and held to the wafer holder on the wafer table TB.

In this case, a load fluctuation due to a mass error at a manufacturing level, a load fluctuation due to a shifting of wires, tubes, or the like, or a load fluctuation due to a mass change when an undepicted wafer holder and a wafer mounted on the wafer table TB are removed can be controlled by controlling the voice coil motors 92A–92C so as to cancel the load change, and by exerting control such that, through the canceling of the load change, the up and down movement of the piston member 115 does not reach its limits.

Furthermore, even if vibrations transmitted from the floor surface side are not controlled by the voice coil motors 92A–92C, the vibrations are dispersed and transmitted respectively to the piston member 115 (or the weight member arranged on the piston member 1115) and the wafer table TB, so compared to the case of using an ordinary air bellows vibration control device, the vibration damping rate is high. In addition, by performing control by the voice coil motors 92A–92C, a high response control can be expected.

The following explains the exposure operation using the exposure apparatus 100 of this embodiment.

First, under the direction of the main control device, a reticle and a wafer are loaded by undepicted reticle and wafer loaders. Furthermore, there are performed, in a specified order, preparation operations such as reticle alignment, baseline measurement or the like using an undepicted reticle alignment microscope, an undepicted reference mark plate in which various reference marks are formed for base line measurement or the like which measures a distance between the optical axis of the projection optical system PL and the detection center of an undepicted off-axis type alignment detecting system on the wafer stage WST, and an undepicted alignment detecting system.

Then, by the main control device, alignment measurement such as EGA (enhanced global alignment) or the like is performed by using an undepicted alignment detecting system. In this type of operation, if the wafer W needs to be moved, the main control device moves the wafer stage WST holding the wafer W in a specified direction via the stage control system. When this alignment measurement is completed, a step-and-scan type exposure operation is performed as shown below.

In terms of this exposure operation, first, the wafer stage WST is moved so that the XY position of the wafer W is at a scanning start position (acceleration start position) for exposure of an initial shot region (first shot) on the wafer W. At the same time, the reticle stage RST is moved so that the XY position of the reticle R is at a scanning start position (acceleration start position). Furthermore, based on the instructions from the main control device, scanning exposure is performed by synchronously moving the reticle R and the wafer W based on the XY position information of the wafer W measured by the wafer interferometer WIF and the XY position information of the reticle R measured by the reticle interferometer RIF.

Thus, when the reticle pattern transfer for one shot region is completed, the wafer stage WST is stepped by one shot region, and scanning exposure is performed for the shot region. Thus, stepping and scanning exposure are repeated in order, and a pattern with the number of shots needed is transferred onto the wafer W.

In the main control device, during the scanning exposure or the like, auto focus and auto leveling are performed by controlling the inclination with respect to the XY plane and the Z position of the wafer W via the stage control device so that focus shifting becomes zero based on a focus shifting signal (defocus signal), e.g., an S curve signal, from a multi-point focus detecting system.

As explained above in detail, according to the vibration control devices of this embodiment, the holding member 62 is supported in a gravity direction, which holds the support target object OB by a pressure of the gas within the gas chamber 69 of the air mount portion 51 (more accurately, gas filled in the gas chamber 69 and in the chamber 79 connected to the gas chamber 69). That is, the mass of the support target object OB is supported by the pressure of the internal gas via the holding member 62. Additionally, based on a state change of at least one of the gas chambers 69 and 79, the voice coil motor 74 changes the internal volume of the gas chamber 79 by driving the movable member 149 which changes the internal volume of the gas chamber 69, and adjusts the position in the gravity direction of the holding member 62. Because of this, for example, if the holding member (and the support target object OB) is displaced in the gravity direction due to vibration or the like, based on the state change of the gas chamber 69 (here, the change of the position in the gravity direction of the holding member 62 and the change of the internal volume of the respective gas chambers 69 and 79 are included in the change of the state of the respective gas chambers due to the vibration to be transmitted to the vibration control device from outside), as the voice coil motor 74 drives the movable member 149, the position in the gravity direction of the holding member 62 is maintained at the original position. That is, the vibration which affects the holding member 62 (and the support target object OB) is promptly controlled. Additionally, the movable member 149 does not have a portion contacting the support target object OB, so even if the movable member 149 is driven, this does not directly generate distortion on the support target object OB, and the support target object OB is driven in the gravity direction according to the change of the internal volume of the respective gas chambers 69 and 79. Therefore, a structure can be used in which rigidity of the gas within the gas chamber 69 is high, so compared to a conventional device, the gas chamber 69 can have a small volume. Furthermore, the internal volume of the gas chamber 79 is smaller than that of the gas chamber 69, so by changing the internal volume of the gas chamber 79 by a small force by driving the movable member 149, the holding member 62 can be driven in the gravity direction by changing the internal volume of the gas chamber 69. In addition, the rigidity of the gas within the gas chamber 69 can be set to be high. Therefore, by driving the movable member 149, the position of the gravity direction of the support target object OB can be controlled with a high response. Additionally, the rigidity of the gas within the gas chamber 69 can be set to be high, so the damping effects of a high frequency vibration such as floor vibration or the like as an air cushion (air spring) becomes preferable. Therefore, according to the vibration control device of this embodiment, a small and lightweight vibration control device is accomplished in which vibration is removed, or at least vibration control effects are good.

Additionally, in this embodiment, by setting the bottom area of the piston member 72 to be smaller than the bottom area of the holding member 62, and by using a weight lighter than that of the support target object OB, the internal space 69 of the air mount portion 51 and the internal space 79 of the piston mechanism 53 can be balanced according to a specified state, and weight reduction of the vibration control device and exposure apparatus can be improved.

Furthermore, in this embodiment, an adjusting mechanism is constituted by electromagnetic actuators (voice coil motors), so the position in the height direction of the holding member 62 can be controlled at an extremely high response. Therefore, the transmission of the vibration can be extremely effectively controlled.

Furthermore, in this embodiment, the movable portion (the piston member 72 which constitutes part of the movable member 149) moves via the gas hydrostatic pressure bearing 150, so the space between the piston member 72 and the cylinder 71 can be maintained in non-contact, and the gas flow from the internal space 79 of the piston mechanism 53 can be controlled.

In addition, according to the vibration control device 91A–91C provided on the wafer stage WST, a first tubular body 111A is mounted on the XY stage 14 inclinably at a fulcrum as a center. A second tubular body 111B having an inside bottom surface that receives pressure is positioned inside the first tubular body 111A via a predetermined space, such that the first and second tubular bodies 111A and 111B are free to slide relative to each other. Because of this, the second tubular body 111B functions as a holding member that holds the wafer table TB. Moreover, because the second tubular body is coupled to the wafer table TB while allowing pivotal movement, the rigidity of the wafer table TB in the XY plane can be substantially zero, thereby the vibration can be effectively controlled.

Moreover, on the circumferential wall of the first tubular body there are provided a plurality of micro apertures 151 which extend from the inner space 112 to the space between the first tubular body and the second tubular body at a predetermined interval in the circumferential direction. Therefore, similar effects can be obtained without providing a separate air bearing mechanism, such as a vacuum pressure type gas static pressure bearing. As such, the vibration control device can made be smaller and lighter in weight.

Furthermore, according to the stage apparatus of this embodiment, the table is held on the stage movable in predetermined directions, by the above-described vibration control device. Therefore, generation of the vibration on the table, that is, the vibration on the wafer, can be tremendously controlled.

In addition, according to the exposure apparatus of this embodiment, at least a part of structures of the exposure apparatus is held by the vibration control device of this invention having high controlling effects of the vibration. Therefore, the vibration of the exposure apparatus can be effectively controlled, thereby being able to provide highly accurate exposure.

Figure 7A:
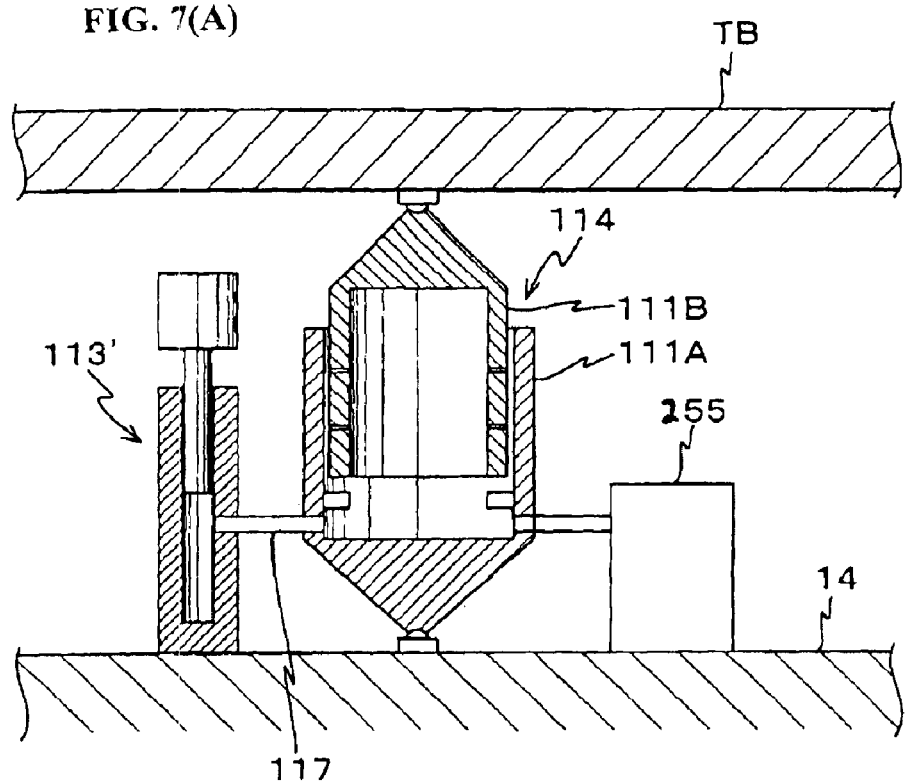
FIG. 7(A) and FIG. (B) show an example of a modification of the vibration control device used in a wafer stage.
Figure 7B:
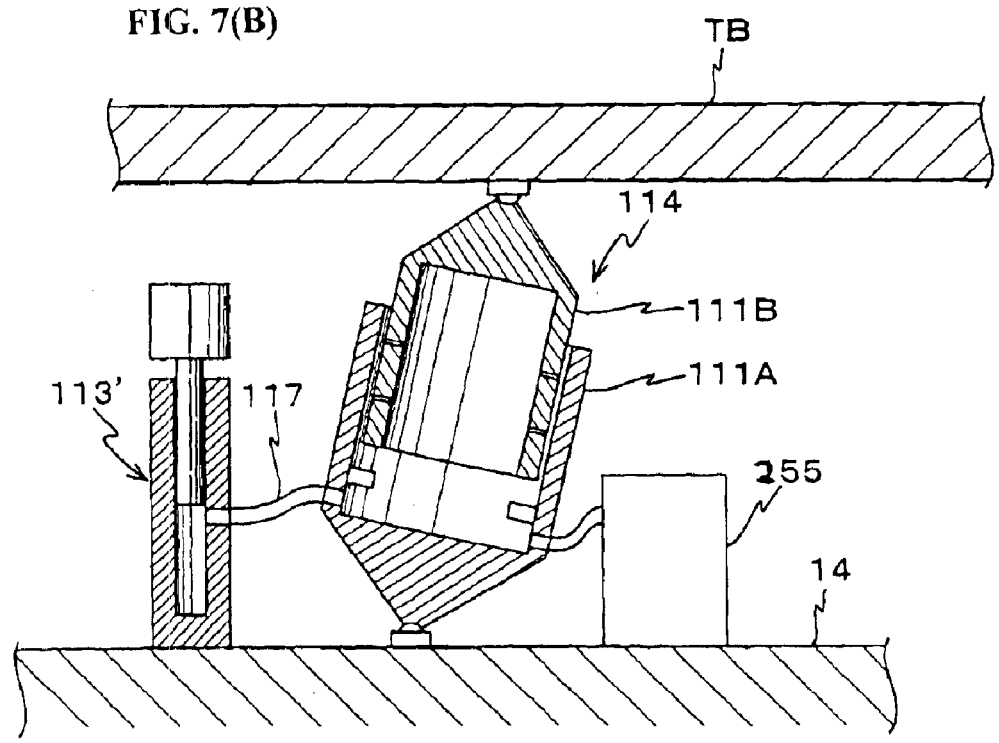

In the exposure apparatus according to the above-described embodiment, a vibration control device having a structure shown in FIG. 7(A) can be used as a vibration control device that holds the wafer table TB. The vibration control device shown in FIG. 7(A) has a feature that it is not provided with an adjustment device integral to the air mount portion 114, but is provided with an adjustment device 113' via an expandable tube 117 formed by a deformable and expandable bellows, which is provided separately from the air mount part 114.

Even when such a structure is used, effects similar to those of the vibration control device shown in FIG. 6(A) can be obtained.

If a space can be secured on the XY stage 14, similarly to the ones described above in relation to the vibration control device on the main body column 50 side, a movable member may be structured by connecting a movable element of a voice coil motor directly to a piston member and may be driven by the voice coil motor, to positively control the volume of the air chamber inside the air mount and the piston mechanism.

The above-described embodiment involved a case in which the wafer table TB of the wafer stage WST is held by the vibration control devices 91A–91D. However, the micro movement stage 24B structuring a reticle stage RST can be held using vibration control device(s) similar to the vibration control devices 91A–91D.

Figure 8:
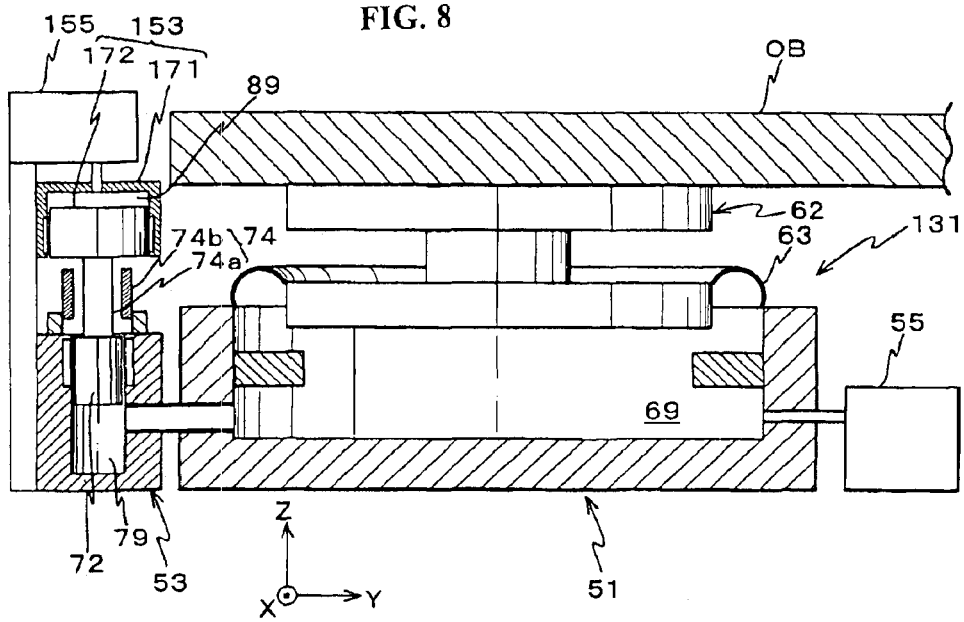
FIG. 8 shows a first example of a modification of the vibration control device used for supporting a body.

In the exposure apparatus in the above-described embodiment, instead of one of the vibration control devices $31A_1$–$31A_3$ (hereafter, for convenience referred to as a "vibration control device 31A"), $31B_1$–$31B_3$ (hereafter, for convenience referred to as a "vibration control device 31B"), $31C_1$–$31C_3$ (hereafter, for convenience referred to as a "vibration control device 31C"), $31D_1$–$31D_3$ (hereafter, for convenience referred to as a "vibration control device 31D"), a vibration control device 131 shown in FIG. 8 can be used as a vibration control device.

The vibration control device 131 shown in FIG. 8 has a feature that the piston mechanism 53 has a gas pressure driving mechanism 153 in addition to the structure of the above-described piston mechanism.

In other words, a piston member 172 that functions as a piston part is connected to the upper part of the piston member 72 that structures the piston mechanism 53, via the movable element 74a that is similar to the above-described movable element. The piston member 172 is inserted into the cylinder 171 of which a lower surface is open. Similarly to the piston member 72, in the outer circumferential surface of the piston member 172, there is provided a gas static pressure bearing not shown in the drawings, such as an air bearing. Because of this, a gas chamber 89 that is in a substantially airtight state is structured between the cylinder 171 and the piston member 172. An electromagnetic regulator 155 is connected to the cylinder 171. Using this electromagnetic regulator 155, the pressure of the gas (it can be the same kind as used with the above-described second gas chamber or a different type) in the gas chamber 89 is controlled by the stage control device based on an instruction of an undepicted main control device. That is, the gas pressure driving mechanism 153 is structured by the cylinder 171, the piston member 172, the gas chamber 89, and the electromagnetic regulator 155.

As described above, by providing the gas pressure driving mechanism 153, the following effects are obtained.

For example, when a moving body, such as a wafer stage WST, is mounted on the supported object OB, if the moving body moves, the load (mass) applied to each of three vibration control devices 131 supporting the supported object OB varies. In this case, normally the load and the internal pressure of the first gas chamber 69 are balanced by controlling the electromagnetic regulator 55 connected on the side of the housing 61 structuring the air mount part 51 to adjust the internal pressure of the first gas chamber 69. However, if the internal pressure of the first gas chamber 69 is simply increased by the electromagnetic regulator 55, the inner pressure of the second gas chamber 79 also increases due to Pascal's principle, and therefore the piston member 72 moves upwardly, due to the difference with the air pressure. On the other hand, if the internal pressure is decreased, the piston member 72 moves downwardly.

Because the upward and downward movement of the piston member 72 causes the upward and downward movement of the holding member 62, it is necessary to generate a force that prevents the holding member 62 from moving upward and downward.

In such a case, in the vibration control device 131 shown in FIG. 8, a regular force is generated by adjusting the internal pressure of the gas pressure driving mechanism 153, without generating the regular force using the voice coil motor 74. As a result, the movement of the piston member 72 can be controlled. Therefore, compared with a case in which the regular force is generated using the voice coil motor 74, for example, heat generated from the voice coil motor 74 can be controlled, and thus the change in heat around the voice coil motor 74 can be effectively controlled.

Figure 9:
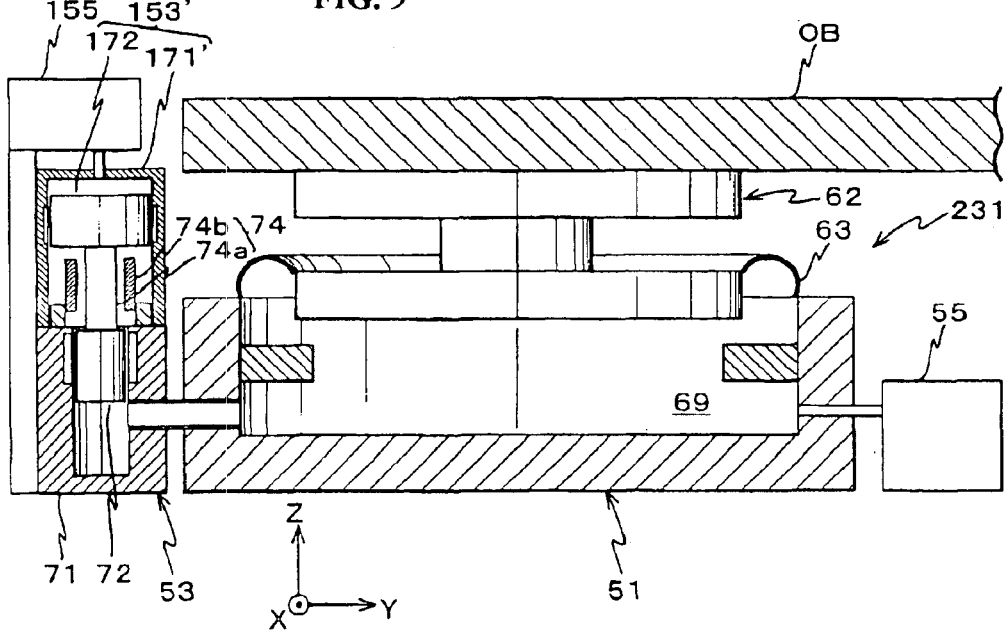
FIG. 9 is a second example of a modification of the vibration control device used for supporting a body.

Moreover, it is also possible to use a vibration control device 231 having a structure shown in FIG. 9, to which changes are further made to the vibration control device 131 shown in FIG. 8. The vibration control device 231 shown in FIG. 9 has a feature that, instead of the gas pressure driving mechanism 153 that structures the vibration control device 131 shown in FIG. 8, a gas pressure driving mechanism 153' is provided.

In the gas pressure driving mechanism 153', a cylinder 171' is connected air-tightly to the cylinder 71. Since by using such a gas pressure driving mechanism 153', gas (e.g., air) leaked from a part of the outer periphery of the piston member 72 provided with the air bearing (a gap between the piston member 72 and the cylinder 71) enters towards the gas pressure driving mechanism 153', the gas is supplied by the electromagnetic regulator 55 on the side of the air mount part 51. By exhausting the gas using the electromagnetic regulator 155 on the side of the piston mechanism 53, the gas supply and exhaust path can be made integral. By doing so, the internal pressure of the first gas chamber 69 and the second gas chamber 79 can be maintained sufficiently high even when the amount of the gas leaked from the cylinder 71 side is large.

Moreover, since rigidity in the horizontal direction (horizontal rigidity) has a large contribution from the rigidity of the diaphragm 63, the vibration control effects in the horizontal direction cannot be obtained sufficiently (i.e., it is difficult to control the floor vibration in the horizontal direction to be transferred to the supported object OB). Therefore, it is also possible to provide a horizontal rigidity reduction mechanism 80 as shown in FIG. 10(A) to the vibration control devices 31B$_2$, 131, and 231, which have effects to vertical rigidity as described using the above-described FIGS. 4–9.

Figure 10A:
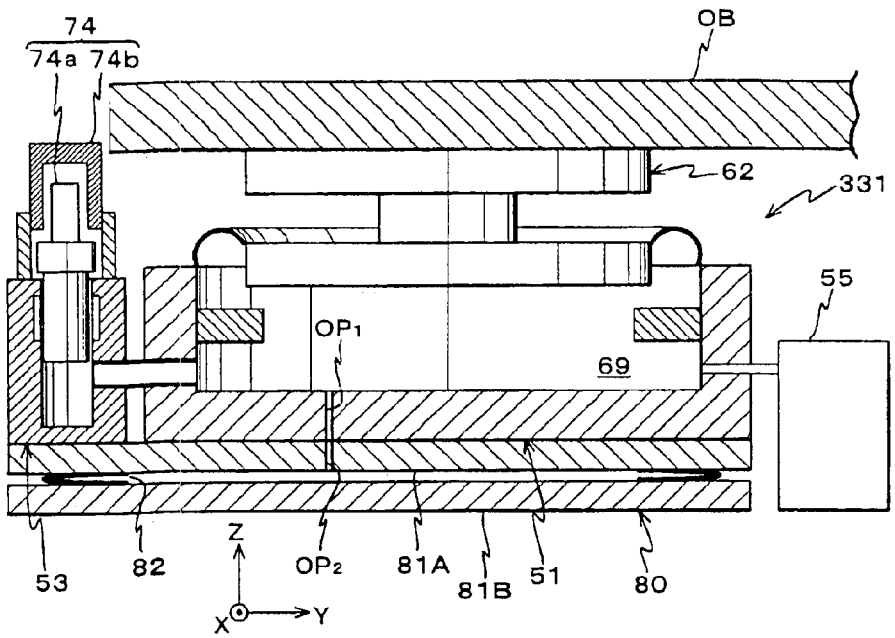
FIG. 10(A) and FIG. 10(B) show examples (third and fourth) of modifications of the vibration control device used for supporting a body.

As shown in FIG. 10A, the horizontal rigidity reduction mechanism 80 is equipped with a plate member 81A as the first bottom wall member, a plate member 81B as the second bottom wall member, and a diaphragm 82 as an elastic member sandwiched by the plate members 81A and 81B.

In addition, on each of the plate member 81A positioning upper side and the housing 61 structuring the air mount part 51, through holes OP$_1$ and OP$_2$ are formed for passing the gas under the plate member 81A.

By using such a horizontal rigidity reduction mechanism 80, the horizontal rigidity of the vibration control device 331 can be reduced. Therefore, the transfer of the horizontal vibration from the floor side to the supported object can be controlled.

Figure 10B:
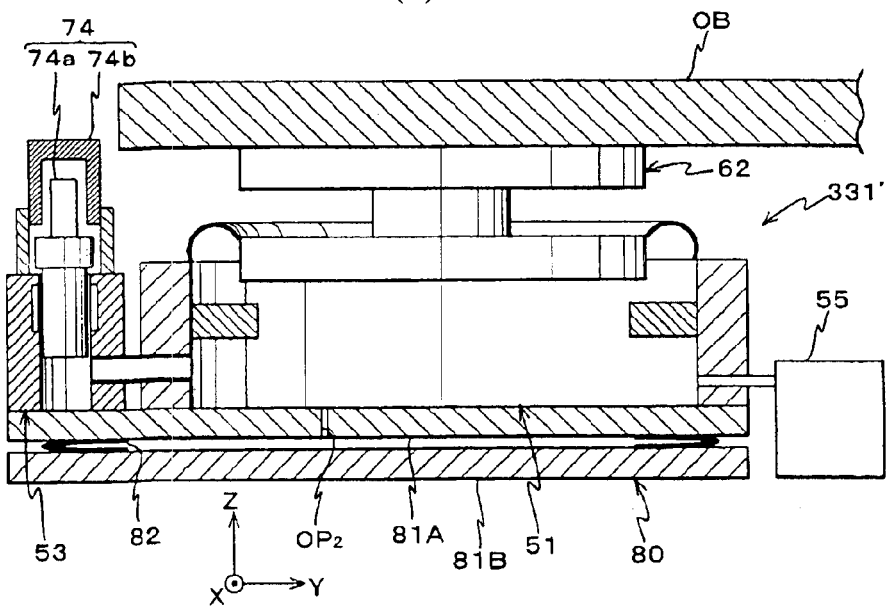

Moreover, as shown in FIG. 10(B), the bottom wall of the housings 61 and 71 that respectively structure the air mount part 51 and the piston mechanism 53 can be removed, and instead of the bottom wall of the housings 61 and 71, the plate member 81A on the upper side of the horizontal rigidity reduction mechanism 80 may be used. By doing so, the vibration control device 331' can be made smaller and lighter in weight.

As the horizontal rigidity reduction mechanism, instead of a structure that uses the above-described diaphragm, a structure that uses an air bearing may also be used. For the air bearing mechanism, the air bearing that is normally used can be provided between two plate members, but it is also possible to provide a structure shown in FIG. 11.

Figure 11:
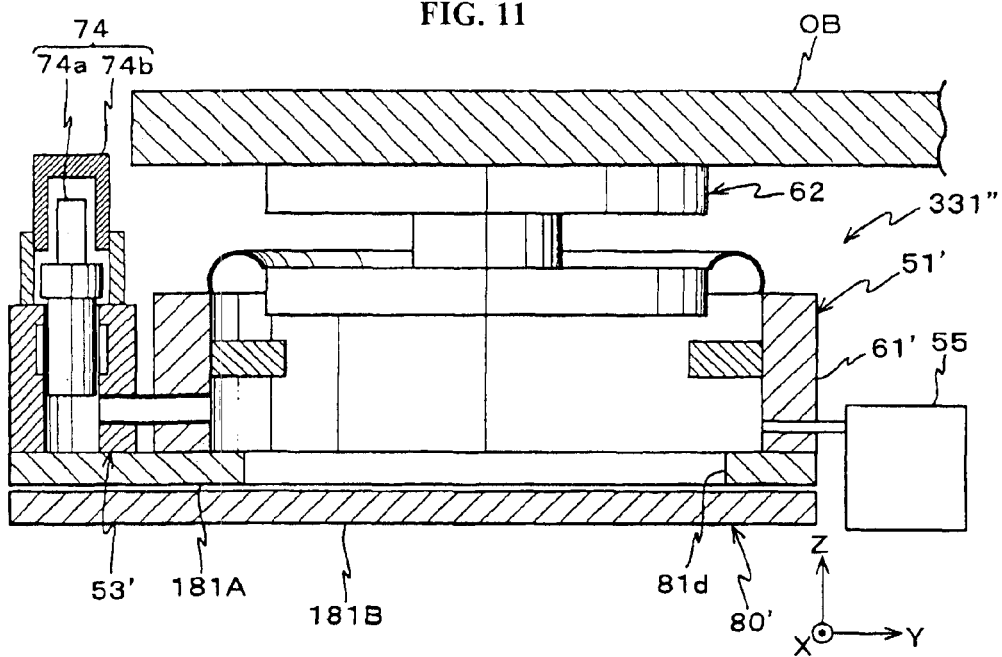
FIG. 11 shows a fifth example of a modification of the vibration control device used for supporting a body.

A horizontal rigidity reduction mechanism 80' shown in FIG. 11 uses a frame-shaped member as a bottom wall 181A of the air mount part 51', to which an opening 81d is formed, and a plate member 181B is provided below the bottom wall 181A formed by the frame-shaped member. By doing so, since the pressure inside the housing 61' of the air mount part 51' is high, sections above the bottom wall 181A are supported by floating, while maintaining a clearance less than about a few μm, due to a static pressure of the gas, such as air, that leaks from the space between the bottom wall 181A and the plate member 181B. Therefore, effects similar to the case where an air bearing is provided below the bottom wall 181A can be obtained.

By adapting such a horizontal rigidity reduction mechanism 80', it is possible to keep the air mount part 51' and the floor side members (plate-shaped member 181B) away from contacting each other in the X, Y and θZ directions. Therefore, it becomes possible to control the vibration from the floor side to be transferred to the supported object OB.

In the above-described embodiment, an explanation was made for a case where the movable member works as a piston. However, the invention is not limited to this. That is, as the movable member, any structures can be used that can vary the volume of the second gas chamber connected to the first gas chamber that supports the weight of the supported object via a holding member using the pressure inside the gas. For example, a structure may be used that uses a diaphragm or an elastic member, such as a spring.

Second Embodiment

Figure 12:
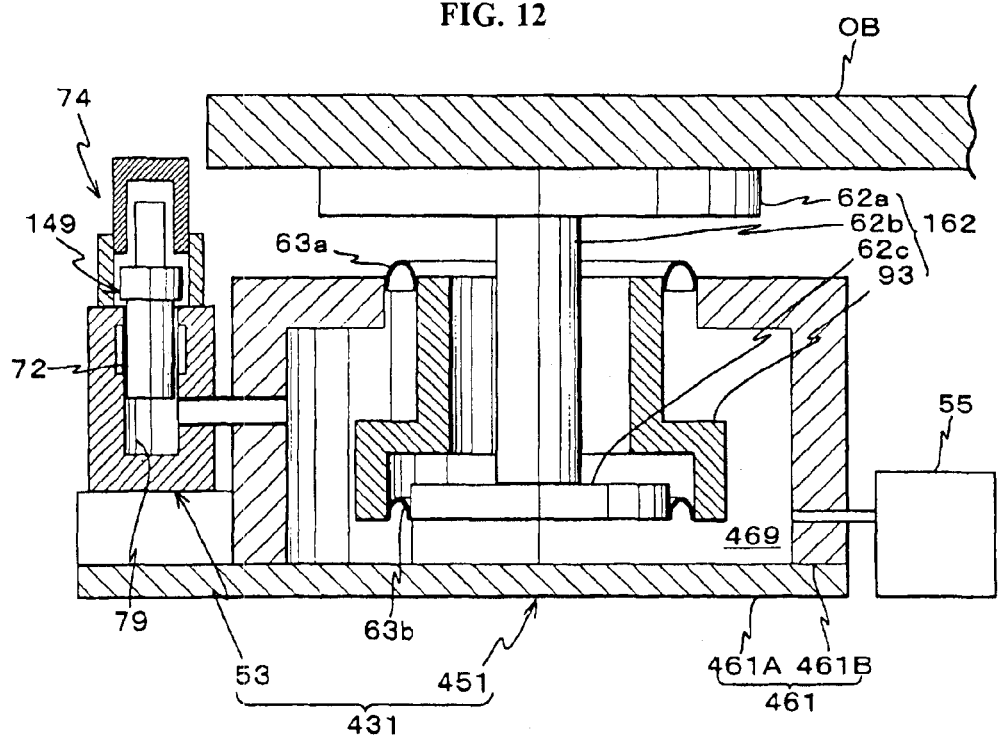
FIG. 12 is a cross sectional view showing a structure of a vibration control device according to a second exemplary embodiment of the invention.

Next, the second embodiment of this invention is described referring to FIG. 12. The exposure apparatus of the second embodiment has a feature that, instead of one of the vibration control devices 31A, 31B, 31C and 31D provided at parts of the body of the exposure apparatus 100 of the above-described first embodiment, a vibration control device 431 shown in FIG. 12 is used as a vibration control device. Other structures are similar to those of the first embodiment. Therefore, to avoid duplication of explanation, while the vibration control device 431 is mainly described, the structures that are the same as the first embodiment will be described using the same reference symbols.

As shown in FIG. 12, the vibration control device 431 of the second embodiment is equipped with an air mount part 451 that supports the supported object OB (the supported object OB is the same as the one in the first embodiment) from below, a piston mechanism 53 that is positioned adjacent to the air mount part 451 and has a second gas chamber 79 connected via a pipe Pb to a first gas chamber 469 formed inside the air mount part 451, and an electromagnetic regulator 55 that adjust pressure of gas, e.g., air, accumulated in the first gas chamber 469 and the second gas chamber 79.

The air mount part 451 is equipped with a housing 461 structured from a bottom plate part 461A and a cylindrical-shaped side wall portion 461B, and a holding member 162 connected to an upper opening of the housing 461 via a diaphragm 63a as the first elastic member and positioned inside the upper opening. The diaphragm 63*a* is formed by a ring-shaped (donut-shaped) rubber material, for example, or other materials having a similar degree of elasticity, that is formed by a tubular body having a cross section that is circular and has a shape in which the tubular body is divided into two along a cross section of the tubular body orthogonal to the center axis of the ring such that the cross section becomes a half circle. The outer edge of the diaphragm 63*a* is connected to the circular edge of the upper opening of the housing 461, and the inner edge is connected to the outer edge of an upper part of a stepped barrel member 93 that structures the holding member 162. In this case, the first gas chamber 469 that is structured by a substantially airtight space inside the housing 461 is formed by the housing 461, the diaphragm 63*a*, and the holding member 162. The holding member 162 is supported at a predetermined position by the pressure of gas, such as air, inside the first gas chamber 469 (hereafter, for a purpose of simplicity, referred to as "gas pressure inside the first gas chamber 469" or "internal pressure of the first gas chamber 469").

The diaphragm 63*a* has characteristics that it has low rigidity in the Z direction and tilt directions (θx and θy directions) and high rigidity in the horizontal directions (mainly X and Y directions).

The holding member 162 has a disk-shaped pressure receiving portion 62*c*, a shaft portion 62*b* having a lower end fixed on the upper surface of the pressure receiving part 62*c*, a disc-shaped holding portion 62*a* that is similar to the pressure receiving portion 62*c* and having a lower surface fixed on the upper surface of the shaft portion 62*b*, a stepped barrel member 93 connected to the pressure receiving portion 62*b* by the diaphragm 63*b* as the second elastic member. The diaphragm 63*b* has a shape and characteristics that are similar to the above-described diaphragm 63*a*. FIG. 12 shows a state in which the entire pressure receiving portion 62*a* and most of the shaft portion 62*b* are inserted in the internal space of the stepped barrel member 93. The length of the above-described shaft portion 62*b* is set relatively long, compared to the shaft portion 62*b* structuring the vibration control device of the first embodiment.

The piston mechanism 53 has a structure similar to the piston mechanism structuring the vibration control device of the above-described first embodiment.

In the vibration control device 431 structured as described above, similar to the first embodiment, minute vibration (external vibration), for example, which is high frequency vibration from the floor surface F side, is insulated at a micro G level, for example, by an attenuating force of air inside the first gas chamber 469 structuring the vibration control device 431 (an elastic force of an air spring structured by the air mount part 451).

In addition, due to a deflecting load that occurs to the wafer stage table by the movement of the wafer stage WST, for example, when a large force acts on the vibration control device or when low frequency vibration occurs, the stage control device drives the movable member 149 in the Z axis direction by controlling the voice coil motor based on a value measured by the above-described phase sensor or the vibration sensor, and changes the inner volume of the second gas chamber 79. As a result, the inner volume of the first gas chamber 469 changes, and the holding member 162 moves in the upward and downward directions. Thereby, effects due to the deflecting load and/or the low frequency vibration are removed.

Furthermore, if vibration of an intermediate frequency that is lower than the above-described external vibration but higher than the above-described low frequency vibration occurs to the wafer stage table due to a reaction force during the acceleration of the wafer stage WST, the stage control device increases or decreases the inner volume of the second gas chamber 79 by controlling the voice coil motor at high speed based on a value measured by the vibration sensor. Accordingly, the inner volume of the first gas chamber 469 increases or decreases; and therefore, the holding member 162 minutely moves in the upward and downward directions. Thus, the above-described vibration is attenuated smoothly.

As described above, in the vibration control device 431, the position control of the holding member 162 in the gravity direction can be performed with extremely high responses, by driving the movable member 149 in the upward and downward directions using the voice coil motor 74.

Moreover, the shaft portion of the vibration control device 431 of the second embodiment is set longer compared to the shaft portion structuring the holding member in the vibration control device of the above-described first embodiment. Therefore, if the shaft portion is supported by the diaphragm 63*b* at its lower side (pressure receiving portion), the diaphragm 63*b* has characteristics that the rigidity in the Z axis direction and the tilt direction (θx and θy directions) is low and that the rigidity in the horizontal directions (mainly X and Y directions) is high. Therefore, a horizontally displaced amount (displaced amount within the horizontal plane) A of the upper end part of the holding member 162 becomes, from a geometrical relationship, $$\Delta = L \times \theta \tag{1}$$

where L is a distance between the support portion 62*a* and the pressure receiving portion 62*c*, and θ is the tilt angle (micro angle). Therefore, by setting the shaft portion as long as the second embodiment, the horizontally displaced amount can be increased, and thus, the horizontal rigidity can be minimized. In other words, the rigidity in the X, Y and θz directions can be made substantially zero, and almost no vibration is transferred to the supported object OB even when the floor experiences horizontal vibration.

As described above, according to the second embodiment, not only the vibration control effects similar to that of the first embodiment are obtained, but also the rigidity in the horizontal direction can be made lower. Therefore, the vibration control device can be realized that has low rigidity with respect to the horizontal direction. In other words, by supporting the supported object using the vibration control device of this embodiment, the vibration can be effectively controlled and removed from the supported object.

Furthermore, according to the exposure apparatus of this embodiment, since at least a part of the parts structuring the main body of the exposure apparatus is held by the vibration control device that has high vibration regulation and controlling effects, the vibration at the main body of the exposure apparatus can be effectively controlled, and thus the exposure can be performed with high accuracy.

For the vibration control device 431 shown in FIG. 12, explanations were made in a case where the piston mechanism 53 connected to the air mount part 451 has the voice coil motor 74, and the movable member 149 is driven by the voice coil motor 74. However, the invention is not limited to this. Instead, various types of cylinder mechanism (e.g., ones having a separate cylinder mechanism) described as modifications of the first embodiment described above can be used.

Third Embodiment

Figure 13:
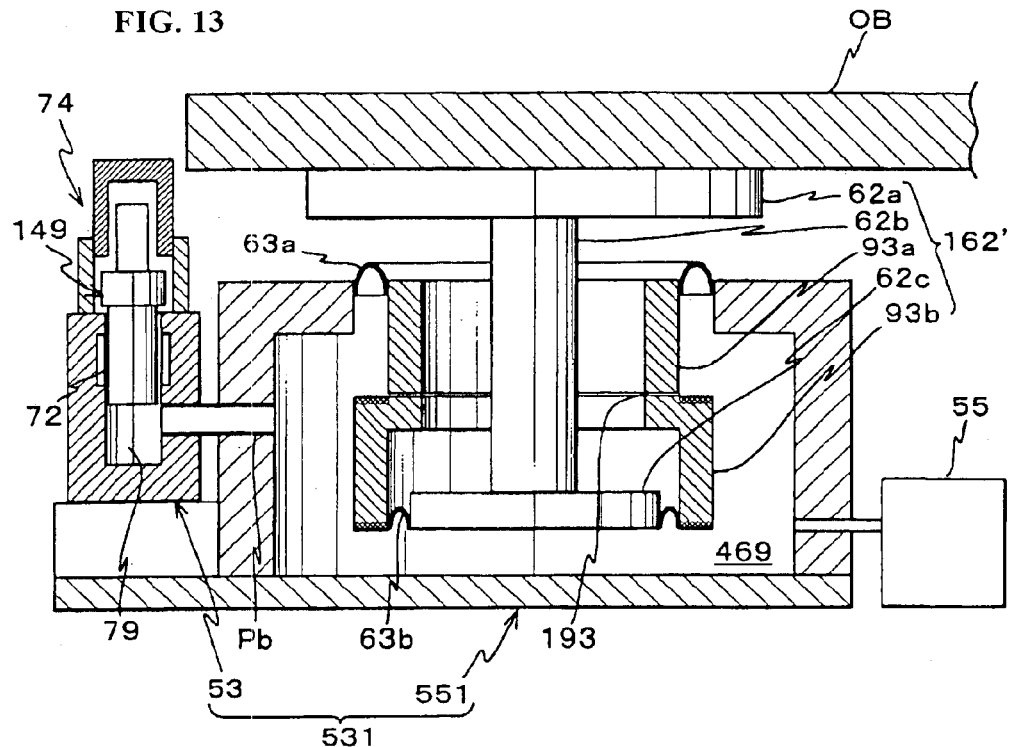
FIG. 13 is a cross sectional view showing a structure of a vibration control device according to a third exemplary embodiment of the invention.

Next, a third embodiment of this invention is described referring to FIG. 13. The exposure apparatus of the third embodiment has a feature that, instead of one of the vibration control devices 31A, 31B, 31C and 31D provided at each part of the body of the exposure apparatus 100 of the above-described first embodiment, the vibration control device 531 shown in FIG. 13 is used as the vibration control device. Other structures are similar to those of the first embodiment. Therefore, to avoid duplication of explanation, while the vibration control device 531 is mainly described, the structural parts that are the same as the first embodiment will be described using the same reference symbols.

The vibration control device 531 of the third embodiment is, as shown in FIG. 13, provided with an air mount portion 551 that supports the supported object OB from below, a piston mechanism 53 provide adjacent to the air mount portion 551 that has the second gas chamber 79 connected via a pipe Pb to the first gas chamber 469 formed inside the air mount portion 551, and the electromagnetic regulator 55 that adjusts the pressure of gas, e.g., air, filled inside the first gas chamber 469 and the second gas chamber 79.

The above-described air mount part 551 is equipped with a housing 461 and a holding member 162' connected to an upper opening of the housing 461 via a diaphragm 63a as the first elastic member and positioned inside the upper opening.

The holding member 162' is equipped with a disc-shaped pressure receiving portion 62c, a shaft portion 62b having a lower end fixed to the upper surface of the pressure receiving portion 62c, a disc-shaped holding portion 62a similar to the above-described pressure receiving portion 62c having a lower end fixed to the upper end of the shaft portion 62b, an approximately tubular lower tubular body 93b connected to the pressure receiving portion 62c via the diaphragm 63b, and an upper barrel body 93a positioned with a predetermined space above the lower tubular portion 93b and connected at its upper end to an inner circumference of the upper opening of the housing 461 via the diaphragm 63a.

Between the lower tubular body 93b and the upper tubular body 93a, there is provided an air bearing mechanism (not shown), such that a predetermined space is maintained between the above-described tubular bodies. In this case, the upper tubular body 93a is structured from an extremely light member. In addition, the lower tubular body 93b has a diameter larger than the upper tubular body 93b. Moreover, areas of exposed sections on the upper and lower surfaces of the lower tubular body 93b (parts that receive internal pressure of the first gas chamber 469 (a double hatched portion in FIG. 13)) are set the same. Therefore, the diaphragm 63b that supports the lower tubular body 93b only needs to have a supporting force of a level by which the lower tubular body 93b can support its weight.

In the vibration control device of the third embodiment, the sections that are directly connected to the support object OB (support portion 62a, shaft portion 62b, pressure receiving portion 62c and lower tubular body 93b) and the sections that are directly connected to the floor side members (housing 461 and the upper tubular portion 93a) are entirely non-contacting in six degrees-of-freedom directions.

As described above, according to the vibration control device of the third embodiment, similar to the first and second embodiments, both high and low frequency vibrations can be controlled and removed. In addition, because it is entirely non-contact in the six degrees-of-freedom directions, the vibration control device in which the rigidity becomes substantially zero in any direction can be realized. Therefore, even if the vibration is transmitted from the floor surface on which the vibration control device is provided, because the parts connected to the floor surface side member and the parts supporting the supported object are entirely non-contacting, the vibration is never transmitted to the support object.

In other words, by supporting the supported object by the vibration control device of this embodiment, vibration on the supported object can be effectively controlled and removed.

Furthermore, according to the exposure apparatus of the third embodiment, since at least a part of the structure of the main body of the exposure apparatus is held by the vibration control device having high vibration regulation and control effects, the vibration on the main body of the exposure device can be effectively controlled, and thus highly accurate exposure becomes possible.

In addition, in the vibration control device 531 shown in FIG. 13, the explanation was made based on a case where the piston mechanism 53 connected to the air mount portion 551 and in which the movable member 149 is driven by the voice coil motor 74. However, the invention is not limited to this. Instead, various types of cylinder mechanisms (e.g., ones having a separate cylinder mechanism) described as modifications of the first embodiment described above may be used.

In the third embodiment, the pressure receiving area on the upper and lower surfaces of the lower tubular body 93b structuring the air mount portion 551 of the vibration control device were set the same. However, if the weight of the lower tubular body 93b is supported by the difference in the force applied to the lower surface and the force applied to the upper surface, the position of the lower tubular body 93b changes greatly by the air spring. Therefore, the lower tubular body 93b may be designed such that it does not interfere with other parts, and thus, a vibration device having lower rigidity in six degrees-of-freedom directions can be made.

Fourth Embodiment

Figure 14:
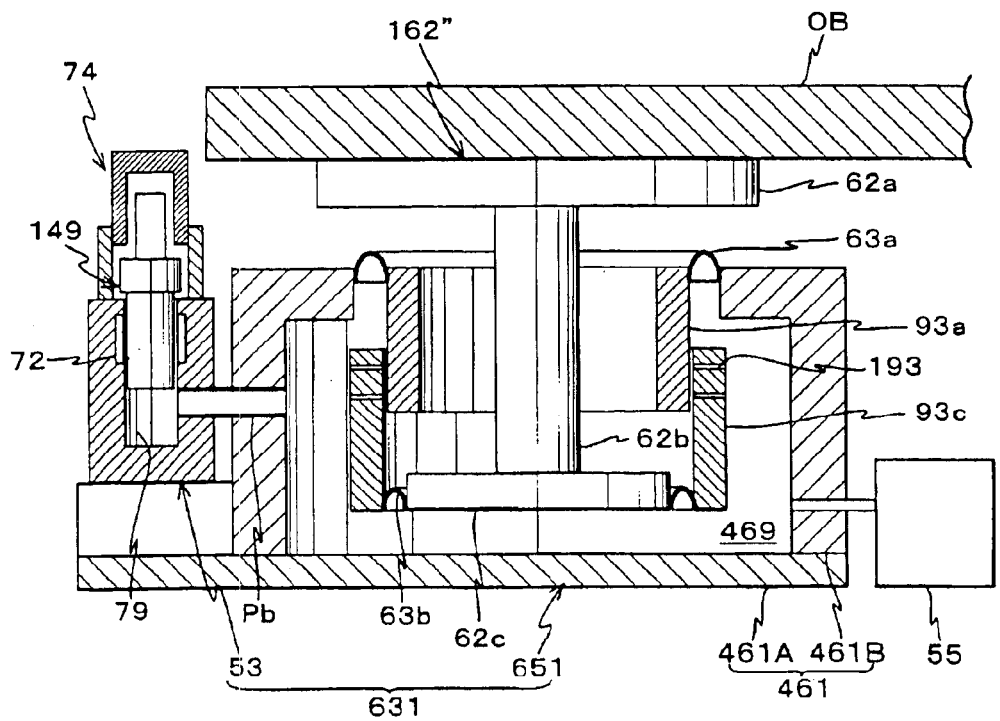
FIG. 14 is a cross sectional view showing a structure of a vibration control device according to a fourth exemplary embodiment of the invention.

Next, the fourth embodiment of this invention is described referring to FIG. 14. The exposure apparatus of the fourth embodiment has a feature that, instead of one of the vibration control devices 31A, 31B, 31C and 31D provided at each part of the body of the exposure apparatus 100 of the above-described first embodiment, the vibration control device 631 shown in FIG. 14 is used as the vibration control device. Other structures are similar to those of the first embodiment. Therefore, to avoid duplication of explanation, while the vibration control device 631 is mainly described, the structural parts that are the same as the first embodiment will be described using the same reference symbols.

The vibration control device 631 of the third embodiment is, as shown in FIG. 14, provided with an air mount portion 651 that supports the supported object OB from below, the piston mechanism 53 provided adjacent to the air mount portion 651 that has the second gas chamber 79 connected via a pipe Pb to the first gas chamber 469 formed inside the air mount portion 651, and the electromagnetic regulator 55 that adjusts the pressure of gas, e.g., air, filled inside the first gas chamber 469 and the second gas chamber 79.

The above-described air mount portion 651 is equipped with a housing 461 and a holding member 162" connected to an upper opening of the housing 461 via the diaphragm 63a as the first elastic member and positioned inside the upper opening.

The holding member 162" is equipped with the disc-shaped pressure receiving portion 62c, the shaft portion 62b having a lower end fixed to the upper surface of the pressure receiving portion 62c, the disc-shaped holding portion 62a similar to the above-described pressure receiving portion 62c having a lower end fixed to the upper end of the shaft portion 62b, the lower tubular body 93c connected to the pressure receiving portion 62c via the diaphragm 63b, and the upper tubular body 93a positioned with a predetermined space above the lower tubular body 93c and connected at its upper end to an inner circumference of the upper opening of the housing 461 via the diaphragm 63a.

On the circumferential wall of the lower tubular body 93c, a plurality of ventilation holes 193 are formed at predetermined intervals around the entire circumference. Through these ventilation holes 193, high-pressure internal gas flows into a space between the upper tubular body 93a and the lower tubular body 93c; thereby, the lower tubular body 93c functions as a gas static pressure bearing (air bearing). Thus, the ventilation holes 193 may be referred as a gas static pressure bearing 193 hereafter. A predetermined space is maintained between the lower tubular body 93c and the upper tubular body 93a by the gas static pressure bearing 193. Moreover, the upper tubular body 93a is structured from a light member, such that it is held by the diaphragm 63a at a predetermined state.

In the vibration control device of the fourth embodiment, the following effects can be obtained in addition to being able to effectively remove the vibrations having high and low frequencies as described above. That is, the upper tubular body 93a extending in the upward and downward directions is supported via the ring-shaped diaphragm 63a at an opening end of the housing 461 having a top surface that is open. The lower tubular body 93c is positioned inside the upper tubular body 93a via a predetermined clearance and is made relatively slidable with respect to the upper tubular body 93a. In addition, for a swing member (a structure formed by the supporting portion 62a, the shaft portion 62b, and the pressure receiving portion 62c), which upper end portion supports the supported object OB from below outside the housing, the pressure receiving portion 62c positioned at the lower end of the swing member is connected via the ring-shaped diaphragm 63b to the lower end of the lower tubular body 93c and supported by floating by gas pressure inside the first gas chamber 469 that acts on the bottom surface of the pressure receiving portion 62c that separates the first gas chamber 469 with the housing 461, the diaphragm 63a, the upper tubular body 93a and the diaphragm 63b. In other words, since the swing member supporting the supported object OB from below has the pressure receiving portion 62c at its lower end connected to the lower end of the lower tubular body 93c via the diaphragm 63b, there is high degree of freedom in the tilt direction. As a result, when the supported object OB is displaced in a horizontal direction (lateral direction), the swing member is easily tilted in accordance with the displacement. Furthermore, if the tilt angle exceeds a predetermined angle (angle allowed by the rigidity of the diaphragm 63b), the upper tubular body 93a and the lower tubular body 93c tilt together with the swing member, and the lower tubular body 93c slides with respect to the upper tubular body 93a in accordance with the horizontal displaced amount of the lower tubular body 93c. As a result, the supported object OB can be horizontally moved without changing its height within its horizontal direction. Moreover, the movement of the swing member in the upward and downward directions can be easily realized by the fact that the lower tubular body 93c slides with respect to the upper tubular body. Therefore, a vibration control device with lower rigidity in 6 degrees-of-freedom angles including Z, X, Y, θx, θy and θz directions can be made.

In other words, the vibrations on the supported object with respect to any direction can be controlled and removed effectively by attenuating the vibrations using the position and orientation changes of the swing member.

Furthermore, according to the exposure apparatus of the fourth embodiment, since at least a part of the structure structuring the main body of the exposure apparatus is held by a vibration control device having high vibration regulation and control effects, the vibration of the main body of the exposure device can be effectively controlled, and thus highly accurate exposure becomes possible.

In addition, the description in the fourth embodiment was made in a case where the upper tubular body 93a is positioned inside the lower tubular body 93c. However, the invention is not limited to this. Instead, a structure may be used in which the upper tubular body 93a is positioned outside the lower tubular body 93c. In such a case, the gas static pressure bearing may be formed on the side of the upper tubular body 93a. By doing so, the weight of the upper tubular body 93a can be supported by the gas pressure of the first gas chamber 469. Therefore, a member that may not be as light as the earlier example can be used as the upper tubular body 93a.

In the fourth embodiment, a plurality of micro apertures 193 formed around the entire circumference of the lower tubular body 93c were used as the gas static pressure bearing. However, the invention is not limited to this. Instead, the air bearing mechanism may be provided on the inner circumference of the lower tubular body 93c or on the outer circumference of the upper tubular body 93a.

In the fourth embodiment, similar to the above-described embodiments, it may be possible to use various structures described in relation to the first embodiment as the piston mechanism connected to the air mount portion 651.

Fifth Embodiment

Figure 15:
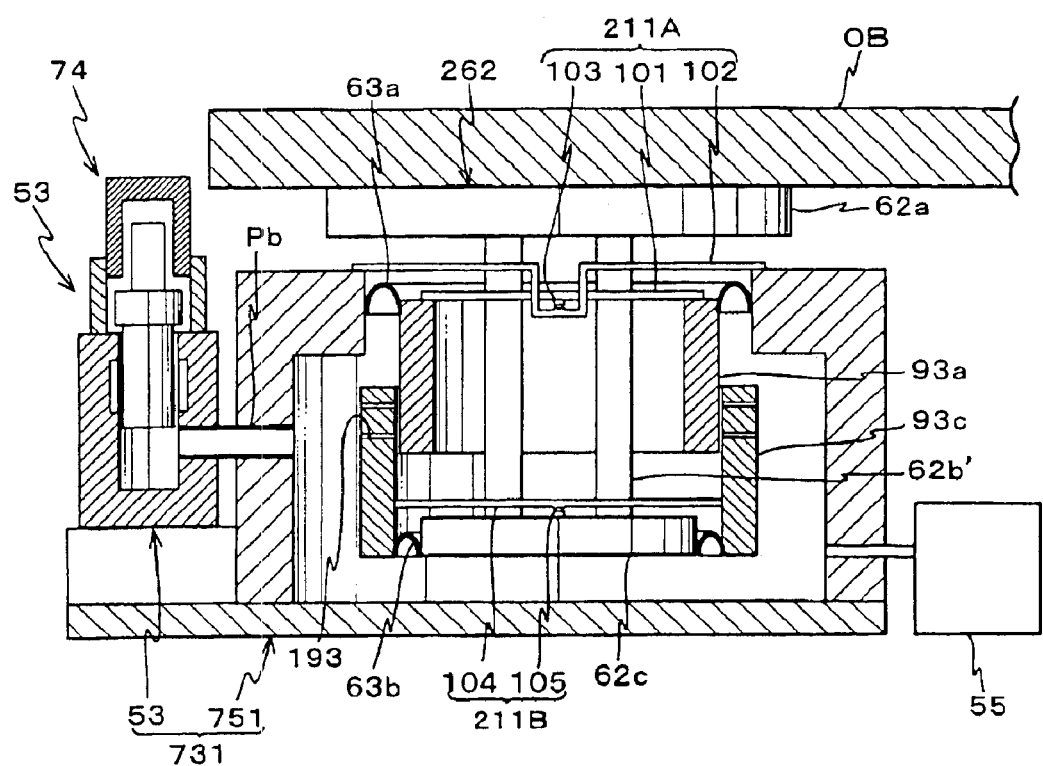
FIG. 15 is a cross sectional view showing a structure of a vibration control device according to a fifth exemplary embodiment of the invention.

Next, the fifth embodiment of this invention is described referring to FIG. 15. The exposure apparatus of the fifth embodiment has a feature that, instead of one of the vibration control devices 31A, 31B, 31C and 31D provided at each part of the body of the exposure apparatus 100 of the above-described first embodiment, the vibration control device 731 shown in FIG. 15 is used as the vibration control device. Other structures may be similar to those of the first embodiment. Therefore, to avoid duplication of explanation, while the vibration control device 731 is mainly described, the structural parts that are the same as the first embodiment will be described using the same reference symbols.

The vibration control device 731 of the third embodiment is, as shown in FIG. 15, provided with an air mount portion 751 that supports the supported object OB from below, a piston mechanism 53 provide adjacent to the air mount portion 751 that has the second gas chamber 79 connected via a pipe Pb to the first gas chamber 469 formed inside the air mount portion 751, and the electromagnetic regulator 55 that adjusts the pressure of gas, e.g., air, filled inside the first gas chamber 469 and the second gas chamber 79.

The air mount portion 751 is equipped with the housing 461, and the holding member 262 connected to an upper opening of the housing 461 via the diaphragm 63a as the first elastic member and positioned inside the upper opening.

The holding member 262 is equipped with a disc-shaped pressure receiving portion 62c, shaft portions 62b having a lower end fixed to the upper surface of the pressure receiving portion 62c, a disc-shaped holding portion 62a similar to the above-described pressure receiving portion 62c having a lower end fixed to the upper end of the shaft portions 62b', a lower tubular body 93c connected to the pressure receiving portion 62c via the diaphragm 63b, and an upper tubular body 93a positioned with a predetermined space above the lower tubular body 93*c* and connected at its upper end to an inner circumference of the upper opening of the housing 461 via the diaphragm 63*a*. In this case, the upper tubular body 93*a* is connected not only to the diaphragm 63*a* but also to the housing via the first support mechanism 211A. Moreover, the lower tubular body 93*c* is connected not only to the diaphragm 63*b* but also to the pressure receiving portion 62*c* via the second support mechanism 211B.

The first support mechanism 211A is equipped with a support receiving tool 101 as the first support member having a plate shape, for example, that is provided on the upper end of the upper tubular body 93*a*, and a support tool 102 as a support arm provided on the upper opening of the housing 461 and supporting the support receiving tool 101 from below at a position matched with the center axis of the upper tubular body 93*a*. The support tool 102 and the support receiving tool 101 are coupled by a ball joint 103.

In addition, the second support mechanism 211B is structured from a support receiving tool 104 as the second support member having a plate shape, for example, provided adjacent to the lower end portion of the lower tubular body 93*c*. By this support receiving tool 104, the pressure receiving portion 62*c* and the lower tubular body 93*c* are coupled via a ball joint 105 provided in the center part of the support receiving tool 104.

Other structures are similar to the vibration control devices described above.

According to the vibration control device 731 structured as described above, the upper tubular body 93*a* and the lower tubular body 93*c* are supported by the first support mechanism 211A and the second support mechanism 211B in such a state that the upper tubular body 93*a* and the lower tubular body 93*c* are allowed only rotational movement. Therefore, the degree of freedom in the Z, X and Y directions are restricted. As such, the disturbance in the behavior of the vibration control device can be controlled.

Figure 16:
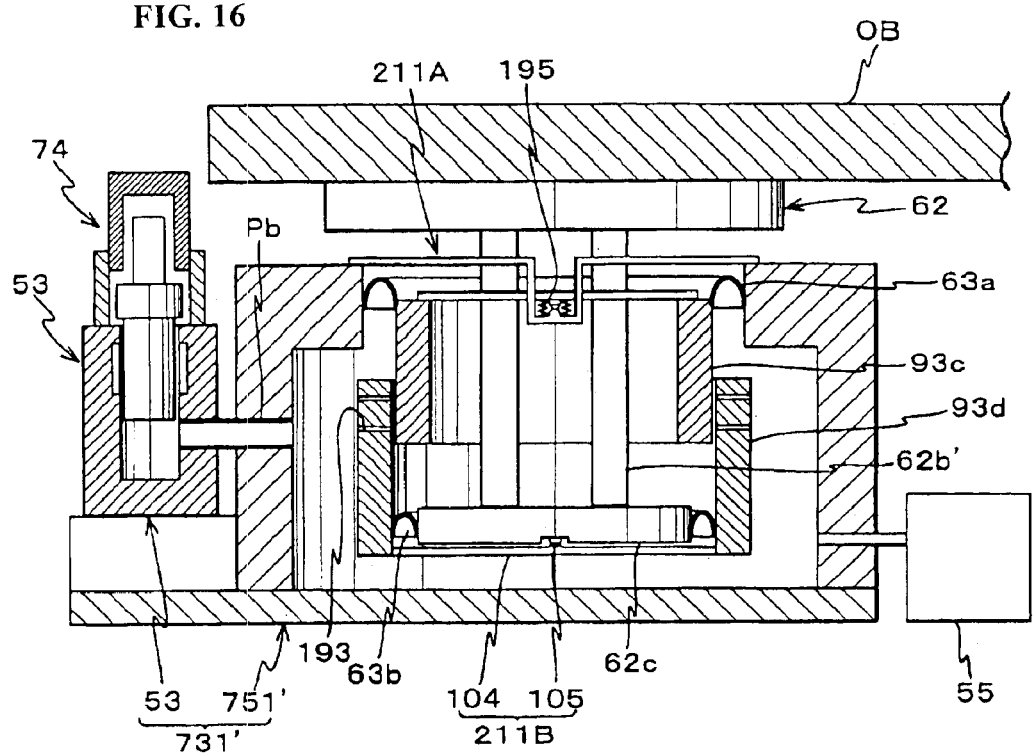
FIG. 16 is a cross sectional view showing an example of a modification of a vibration control device according to a fifth exemplary embodiment of the invention.
Figure 17A:
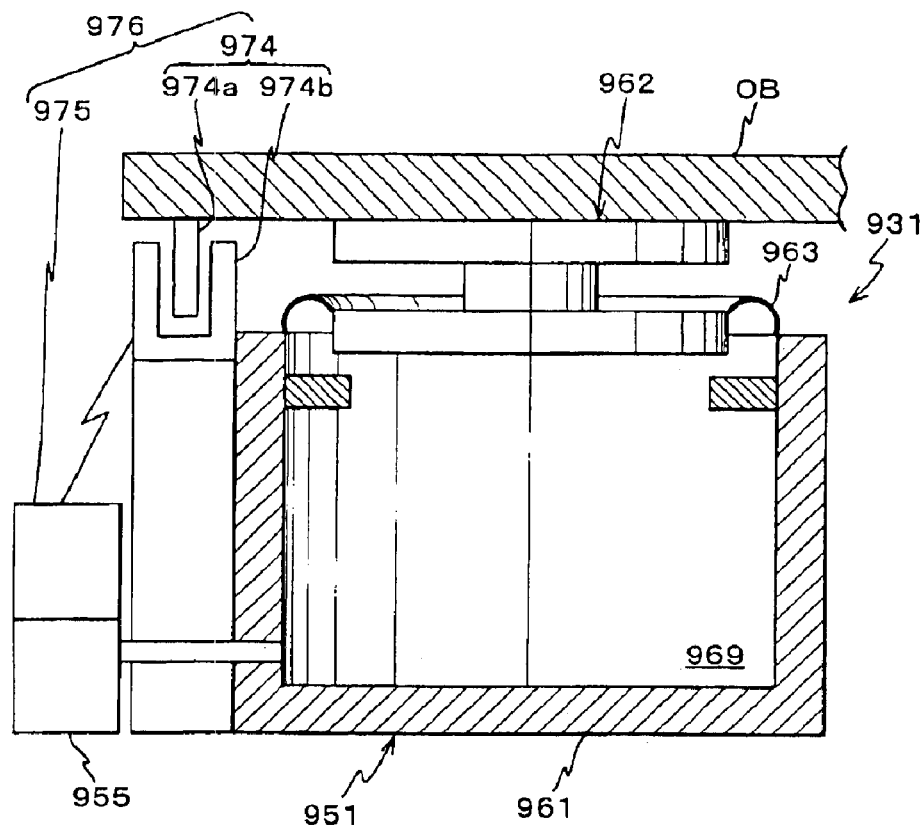
FIGS. 17(A) and 17(B) are drawings for explaining a conventional vibration control device.
Figure 17B:
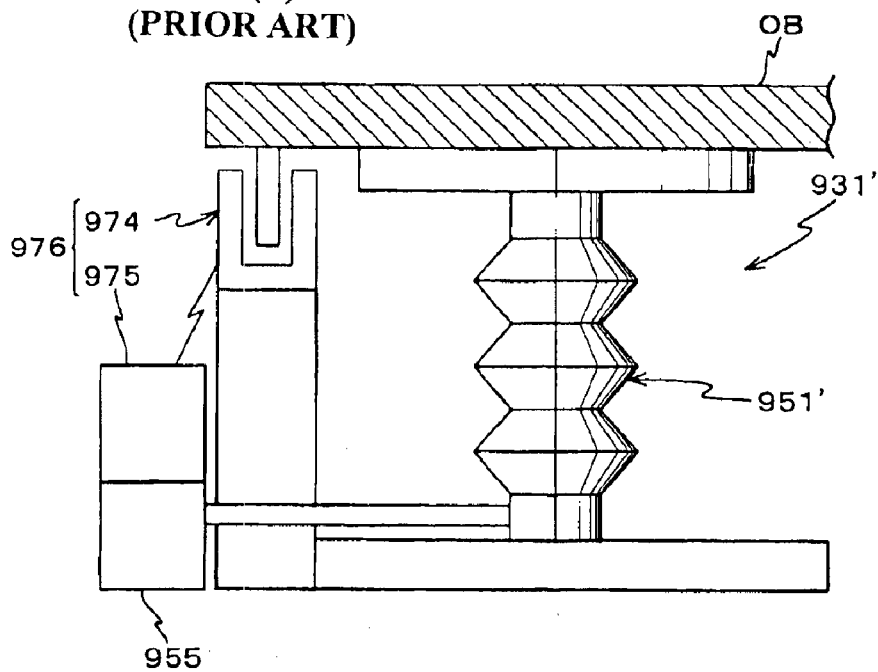
Figure 18A:
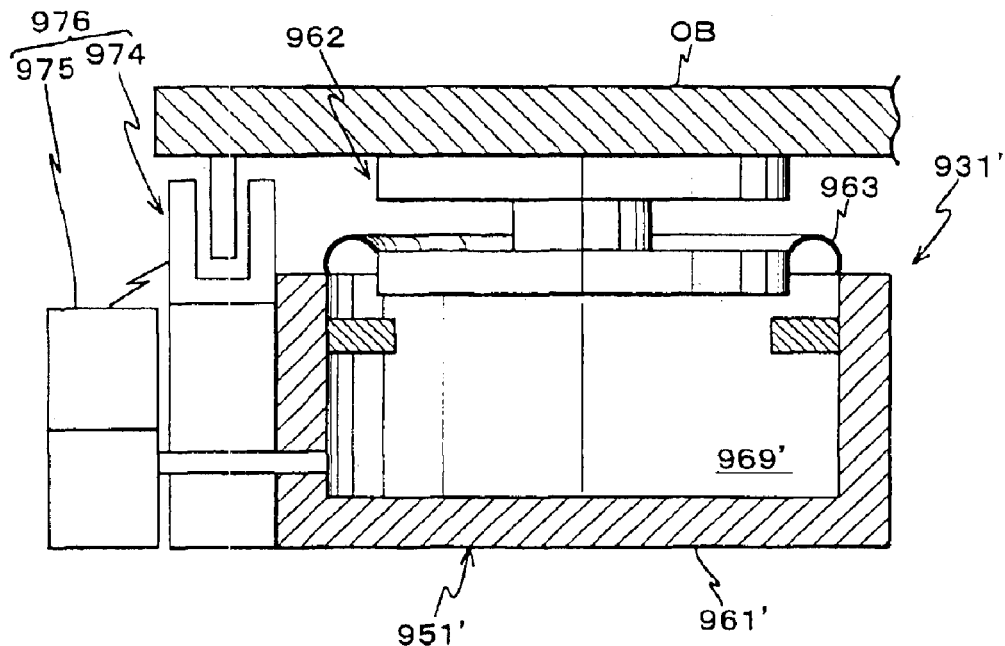
FIGS. 18(A) and 18(B) are drawings for explaining problems addressed by the invention.
Figure 18B:
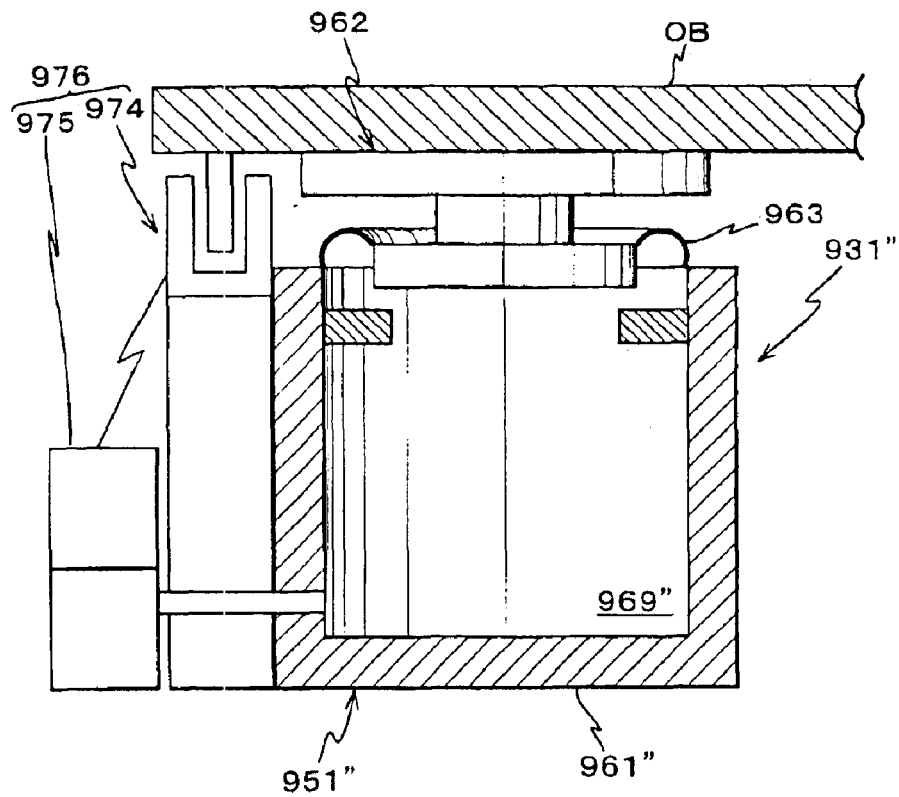

As shown in FIG. 16, the point of the support receiving tool 101 supported by the support tool 102 structuring the first support mechanism 211A (a point at which the ball joint is provided) and a rotational center of the diaphragm 63*a* may be matched, and the point of the pressure receiving portion 62*c* supported by the support tool 104 structuring the second support mechanism 211B (a point at which the ball joint is provided) and a rotational center of the diaphragm 63*b* may be matched. An elastic member (compressed coil spring) for controlling the rotation of the support receiving tool about the ball joint may be provided between the support tool 102 and the support receiving tool 101 structuring the first support mechanism 211A. By doing so, more stable characteristics of the vibration control device can be provided.

Furthermore, instead of providing the elastic member (compressed coil spring) between the support tool 102 and the support receiving tool 101 structuring the first support member 211A, by increasing the rigidity of the ball joint in the rotational direction or stiffness of the diaphragm, the rigidity of the upper tubular body 93*a* in the rotational direction can be increased.

As described above, according to the vibration control device of the fifth embodiment, similar to the embodiments described above, not only the vibrations having high and low frequencies can be effectively controlled and removed, but also occurrence of a situation in which the position and orientation of the swing member are not recoverable due to changes in the position and orientation into various conditions, can be effectively controlled. Therefore, stable functions of the vibration control device can be possible.

In other words, vibrations in any direction can be stably attenuated by changes in the position and orientations of the swing member, and thus the vibration on the supported object can be effectively controlled and removed.

Furthermore, according to the exposure apparatus of the fifth embodiment, since at least a part of the structures of the main body of the exposure apparatus is held by the vibration control device that has high vibration regulation and control effects and provides a stable performance, the vibration of the main body of the exposure apparatus can be effectively controlled, and thereby highly accurate exposures can become possible.

In addition, ball joints were used at a coupling point between the first support mechanism and the upper tubular body 93*a* and a coupling point between the second support mechanism and the lower tubular body 93*c*. However, the invention is not limited to these. Various types of mechanism can be used as long as the linking mechanism has the degree of freedom only in the rotational direction, such as a flexure.

Moreover, in the fifth embodiment, similar to before, various structures described in relation to the first embodiment may be used as a piston mechanism connected to the air mount portion 651.

Each embodiment described above was explained based on a case in which the invention is applied in a step-and-scan type projection exposure apparatus using a single wafer stage. However, this invention can also be used in other exposure apparatus, such as a step-and-scan type projection exposure apparatus using double wafer stage, a step-and-repeat type projection exposure apparatus, or a proximity exposure apparatus.

Furthermore, the exposure apparatus of the above-describe embodiment can be produced by installing an illumination optical system and a projection optical system structured from a plurality of lenses, adjusting the optics, mounting a reticle stage and a wafer stage composed of many mechanical parts onto the main body of the exposure apparatus, connecting wires and conduits, and conducting adjustments as a whole (e.g., electrical adjustment and functional tests). It may be desirable to produce the exposure apparatus in a clean room in which a degree of cleanness and the like are controlled.

In addition, this invention can be applied not only to the exposure apparatus for semiconductor production, but also to an exposure apparatus for making liquid crystal devices that transfers liquid crystal display element patterns onto a rectangular glass plate, and an exposure apparatus for producing a display device, such as plasma displays and organic ELs, thin film magnetic heads, imaging elements (e.g., CCD), micro machines, DNA chips and the like.

Furthermore, this invention may be applied to an exposure apparatus that transfers circuit patterns onto glass substrates or silicon wafers, to produce not only semiconductors and micro devices, but also reticles and masks used for photo-exposure apparatus, EUV exposure apparatus, X ray exposure apparatus, and electron optical apparatus. Here, in an exposure apparatus that uses DUV (i.e., far-ultraviolet) light or VUV (vacuum ultraviolet), a reflective reticle is generally used, and as a reticle substrate, a quartz glass, a quartz glass doped by fluorine, fluorite, magnesium fluoride, or crystal is used. In proximity type X ray exposure apparatus and electron exposure apparatus, transmissive masks (stenciled masks and membrane masks) are used, and silicon wafer or the like is used as a mask substrate.

The semiconductor device may be produced through a step of designing functions and performances of the device, a step of producing a reticle based on the design step, a step of producing a wafer from a semiconductor material, a step of transferring the reticle pattern onto the wafer using the exposure apparatus of the above-described embodiments, a step of assembling the device (including dicing processes, bonding processes, and packaging processes).

As described above, according to this invention, a new type of a vibration control device that has excellent vibration removal or control characteristics can be provided.

According to the stage device of this invention, generation of vibration can be controlled at a great level.

According to the exposure apparatus of this invention, highly accurate exposure can be achieved.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A vibration control device, comprising:
    a holding member that holds an object;
    a first gas chamber that supports the holding member in a gravity direction through internal gas pressure;
    a second gas chamber coupled to the first gas chamber and having a volume smaller than a volume of the first gas chamber;
    a movable member that changes the volume of the second gas chamber and changes the volume of the first gas chamber; and
    a drive that drives the movable member to adjust a position of the holding member in the gravity direction based on a state change of at least one of the first and second gas chambers.

2. The vibration control device of claim 1, wherein the drive comprises an electromagnetic actuator that drives the movable member.

3. The vibration control device of claim 1, wherein the movable member has a weight member that is lighter than the object.

4. The vibration control device of claim 1, wherein the second gas chamber comprises a tubular first cylinder and the movable member, which moves along an inner peripheral surface of the first tubular cylinder.

5. The vibration control device of claim 4, wherein the drive includes a gas pressure driving mechanism that drives the moveable member through gas pressure that opposes an internal gas pressure of the second gas chamber.

6. The vibration control device of claim 5, wherein:
    the movable member includes a piston at an end portion of the movable member that is opposite to a portion that moves along the inner peripheral surface of the first tubular cylinder; and
    the gas pressure driving mechanism includes a second cylinder having an inner peripheral surface along which the piston moves and a gas supply mechanism that supplies gas into a gas chamber formed by the piston and the second cylinder.

7. The vibration control device of claim 6, wherein the second cylinder is connected to the first cylinder.

8. The vibration control device of claim 1, wherein the movable member moves via a gas hydrostatic pressure bearing.

9. The vibration control device of claim 1, wherein the first gas chamber includes: (i) a tubular body tiltably attached to a base member so as to be tiltable about a fulcrum, and (ii) the holding member, which is arranged via a specified space on either an inner surface side or an outer surface side of the tubular body, is slidable relative to the tubular body, and has an inner bottom surface that serves as a pressure receiving surface that receives pressure of the gas, and the holding member is coupled in a state that allows pivoting of the tubular member with respect to the object.

10. The vibration control device of claim 9, wherein, among the tubular body and the holding member, a tubular peripheral wall positioned on an inner peripheral side has formed therein, at a specified spacing in a peripheral direction, a plurality of micro-apertures extending from the first gas chamber to the specified space.

11. The vibration control device of claim 1, wherein the first gas chamber is defined by: (i) a housing having an open top surface, and (ii) the holding member, which is connected to the open top surface of the housing via a first elastic member.

12. The vibration control device of claim 11, wherein a bottom wall of the housing includes first and second bottom wall members that oppose each other via a specified clearance, and an annular elastic member that connects the first and second bottom wall members and maintains the clearance.

13. The vibration control device of claim 11, wherein a bottom wall of the housing includes a frame-shaped member having an aperture in a center, a plate-shaped member arranged opposing a bottom surface side of the frame-shaped member via a specified clearance, and a gas hydrostatic pressure bearing provided between the frame-shaped member and the plate-shaped member and which maintains the specified clearance.

14. The vibration control device of claim 11, wherein:
    the holding member includes a stepped tubular first member connected to the open top surface of the housing via the first elastic member in a suspended supported state, and a second member having a pressure receiving portion connected to a bottom open end of the tubular first member via an annular second elastic member and which receives, at a bottom end, internal air pressure of the first gas chamber, and
    the second member includes (i) a holding portion that holds the object outside the housing, (ii) the pressure receiving portion, and (iii) a shaft portion that connects the pressure receiving portion and the holding portion and extends through an interior of the first member in a vertical direction.

15. The vibration control device of claim 14, wherein the first member includes a first tubular body connected to the pressure receiving portion via the second elastic member and is floatingly supported by the gas pressure along with the pressure receiving portion, and a second tubular body that has a lower end surface opposing an upper end surface of the first tubular body via a specified clearance, and having an upper end portion connected to the open top surface of the housing via the first elastic member.

16. The vibration control device of claim 14, wherein the first member comprises a first tubular body that is connected to the pressure receiving portion via the second elastic member and is floatingly supported by the gas pressure along with the pressure receiving portion, and a second tubular body that opposes either an inner peripheral surface or an outer peripheral surface of the first tubular body via a specified clearance and has an upper end portion connected to the open top surface of the housing via the first elastic member.

17. The vibration control device of claim 16, wherein, one of the first tubular body and the second tubular body that is positioned on an outer peripheral side has formed therein micro apertures that extend through a wall at a position opposing the other one of the tubular bodies.

18. A vibration control device, comprising:

a housing having an open top surface;

a first tubular body supported at the open top surface of the housing via an annular first elastic member and extending in a vertical direction;

a second tubular body positioned either inside or outside the first tubular body via a specified space and being relatively slidable with respect to the first tubular body;

a movable member that is connected to a lower end of the second tubular body via an annular second elastic member, has a pressure receiving portion at a lower end, the pressure receiving portion, along with the first elastic member, the first tubular body and the second elastic member defining a gas chamber, the movable member being floatingly supported by gas pressure inside the gas chamber that acts on a bottom surface of the pressure receiving portion and having a top end portion that serves as a support portion that supports the object outside the housing from below.

19. The vibration control device of claim 18, wherein, one of the first and second tubular bodies that is positioned at an outer peripheral side has formed therein, at a specified interval along a peripheral direction, micro apertures that connect the gas chamber and the specified space.

20. The vibration control device of claim 18, wherein the first and second tubular bodies comprise cylindrical tubular bodies, the vibration control device further comprising:

a first support mechanism that includes: a first support member mounted on an upper end of the first tubular body; a support arm that is mounted on an open end portion of the housing and has a support point that supports a center of the first support member from below; and a coupling mechanism that integrally couples the first tubular body to the support arm at the support point in a manner that allows only rotation of the first tubular body; and a second support mechanism that includes a second support member mounted inside the second tubular body, and a coupling mechanism that couples the pressure receiving portion of the movable member to the second support member at a coupling point at a center of the second support member in a manner that allows only rotation.

21. The vibration control device of claim 20, wherein the coupling point is set at a position that matches a rotational center of the second elastic member.

22. The vibration control device of claims 21, further comprising an elastic urging member that urges the support arm in a direction that suppresses rotation of the first tubular body with respect to the support arm between the support arm and the first support member.

23. The vibration control device of claim 18, further comprising an adjusting device that includes a separate chamber that is connected to the gas chamber and has a volume smaller than a volume of the gas chamber, the volume being variable by displacement of a movable member that forms part of the adjusting device, the position of the movable member in a gravity direction being adjusted by variation of the volume of the separate chamber and the gas chamber connected thereto according to positional variation of the movable member.

24. The vibration control device of claim 23, wherein the separate chamber is formed by a cylindrical tubular cylinder and the movable member, which moves along an inner peripheral surface of the tubular cylinder.

25. The vibration control device of claim 23, wherein the movable member has a weight member that is lighter than the object.

26. The vibration control device of claim 23, wherein the adjusting device includes an electromagnetic actuator that drives the movable member.

27. An exposure apparatus that exposes a photosensitive object through an energy beam and forms a specified pattern on the photosensitive object, comprising:

at least three vibration control devices, each corresponding to the vibration control device according to claim 18, and that hold at least a portion of the structural components that form the exposure apparatus main body by which the exposure is carried out at least at three points.

28. The exposure apparatus of claim 27, wherein:

the exposure apparatus main body includes a mask stage that holds a mask in which is formed the specified pattern, an object stage on which the photosensitive object is mounted, and a body including a mask stage base on which is formed a movement surface of the mask stage and an object stage base on which is formed a movement surface of the object stage, and at least a portion of the body is held by the vibration control device.

29. The exposure apparatus of claim 27, wherein the exposure apparatus main body includes a projection optical system that projects the energy beam, which has passed through the mask, onto the photosensitive object, the projection optical system being held by the vibration control device.

30. A stage device, comprising:

a stage that is movable in a specified direction;

a table arranged above the stage; and at least three vibration control devices, at least one of which is the vibration control device of claim 9, and that holds the table above the stage.

31. The stage device of claim 30 wherein each of the at least three vibration control devices is the vibration control device of claim 9.

32. The stage device of claim 30, further comprising:

a first micro driving mechanism that micro-drives the table in a horizontal plane; and a second micro driving mechanism that micro-drives the table in a direction perpendicular to the horizontal plane and in an inclined direction with respect to the horizontal plane.

33. An exposure apparatus that exposes a photosensitive object through an energy beam and forms a specified pattern on the photosensitive object, comprising:

at least three vibration control devices, each corresponding to the vibration control device according to claim 1, and that hold at least a portion of the structural components that form the exposure apparatus main body by which the exposure is carried out at least at three points.

34. The exposure apparatus of claim 33, wherein:

the exposure apparatus main body includes a mask stage that holds a mask in which is formed the specified pattern, an object stage on which the photosensitive object is mounted, and a body including a mask stage base on which is formed a movement surface of the mask stage and an object stage base on which is formed a movement surface of the object stage, and at least a portion of the body is held by the vibration control device.

35. The exposure apparatus of claim 33, wherein the exposure apparatus main body includes a projection optical system that projects the energy beam, which has passed through the mask, onto the photosensitive object, the projection optical system being held by the vibration control devices.

* * * * *